(12) United States Patent
Kato

(10) Patent No.: US 11,973,024 B2
(45) Date of Patent: Apr. 30, 2024

(54) SEMICONDUCTOR MEMORY DEVICE

(71) Applicant: Kioxia Corporation, Tokyo (JP)

(72) Inventor: Hisashi Kato, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 302 days.

(21) Appl. No.: 17/201,427

(22) Filed: Mar. 15, 2021

(65) Prior Publication Data

US 2022/0084938 A1    Mar. 17, 2022

(30) Foreign Application Priority Data

Sep. 17, 2020 (JP) .................................. 2020-156710

(51) Int. Cl.

| | | |
|---|---|---|
| *H10B 43/27* | (2023.01) | |
| *H01L 21/311* | (2006.01) | |
| *H01L 21/768* | (2006.01) | |
| *H01L 23/522* | (2006.01) | |
| *H01L 23/528* | (2006.01) | |
| *H10B 41/27* | (2023.01) | |

(52) U.S. Cl.
CPC .... *H01L 23/5226* (2013.01); *H01L 21/31116* (2013.01); *H01L 21/31144* (2013.01); *H01L 21/76816* (2013.01); *H01L 21/76877* (2013.01); *H01L 23/5283* (2013.01); *H10B 41/27* (2023.02); *H10B 43/27* (2023.02)

(58) Field of Classification Search
CPC ........ H10B 43/00–50; H10B 20/40–65; H10B 53/20; H10B 41/20–27; H10B 43/20–27; H10B 51/20; H10B 63/84–845; G11C 16/0466–0475; G11C 27/005; G11C 11/5671; H01L 22/10–14
See application file for complete search history.

(56) References Cited

U.S. PATENT DOCUMENTS

| | | | | |
|---|---|---|---|---|
| 8,822,285 | B2 * | 9/2014 | Hwang | H10B 43/40 |
| | | | | 438/257 |
| 9,548,315 | B2 | 1/2017 | Ishiduki et al. | |
| 10,483,124 | B2 * | 11/2019 | Sawano | H10B 41/50 |
| 10,763,277 | B2 | 9/2020 | Oike et al. | |
| 11,114,379 | B2 * | 9/2021 | Gossman | H10B 43/27 |
| 11,296,105 | B2 * | 4/2022 | Kim | H10B 41/35 |

(Continued)

FOREIGN PATENT DOCUMENTS

| | | |
|---|---|---|
| JP | 2019-121769 A | 7/2019 |
| JP | 2019-161059 A | 9/2019 |

*Primary Examiner* — Eric A. Ward
*Assistant Examiner* — Nora Taylor Nix
(74) *Attorney, Agent, or Firm* — Oblon, McClelland, Maier & Neustadt, L.L.P.

(57) ABSTRACT

A semiconductor memory device according to an embodiment includes a substrate, conductive layers, pillars, and contacts. The substrate includes first and second areas, and block areas. The conductive layers are divided for each of the block areas. The conductive layers includes terraced portions. The contacts are respectively provided on the terraced portions for each of the block areas. The second area includes a first sub area and a second sub area. The first sub area includes a first stepped structure. The second sub area includes a second stepped structure and a first pattern. The first pattern is continuous with any one of the conductive layers. The first pattern is arranged between the first stepped structure and the second stepped structure.

20 Claims, 31 Drawing Sheets

(56) References Cited

U.S. PATENT DOCUMENTS

| | | | |
|---|---|---|---|
| 11,437,318 B2* | 9/2022 | Nguyen | H10B 41/27 |
| 2017/0263556 A1* | 9/2017 | Tessariol | H01L 23/5283 |
| 2020/0251490 A1* | 8/2020 | Matsumoto | H01L 23/5226 |
| 2021/0296334 A1* | 9/2021 | Zhang | H10B 41/35 |
| 2021/0296335 A1* | 9/2021 | Sun | H10B 41/27 |

* cited by examiner

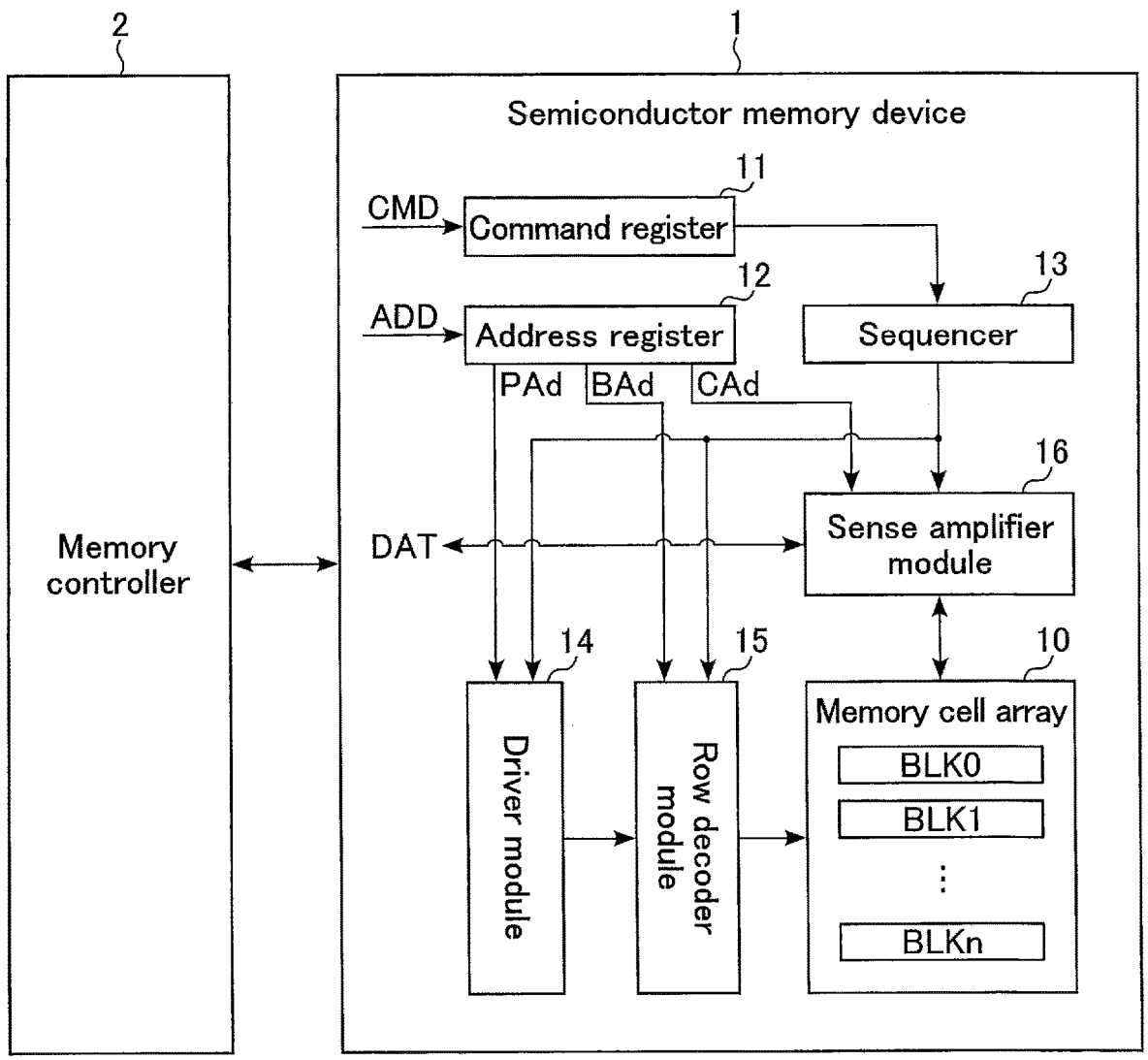
F I G. 1

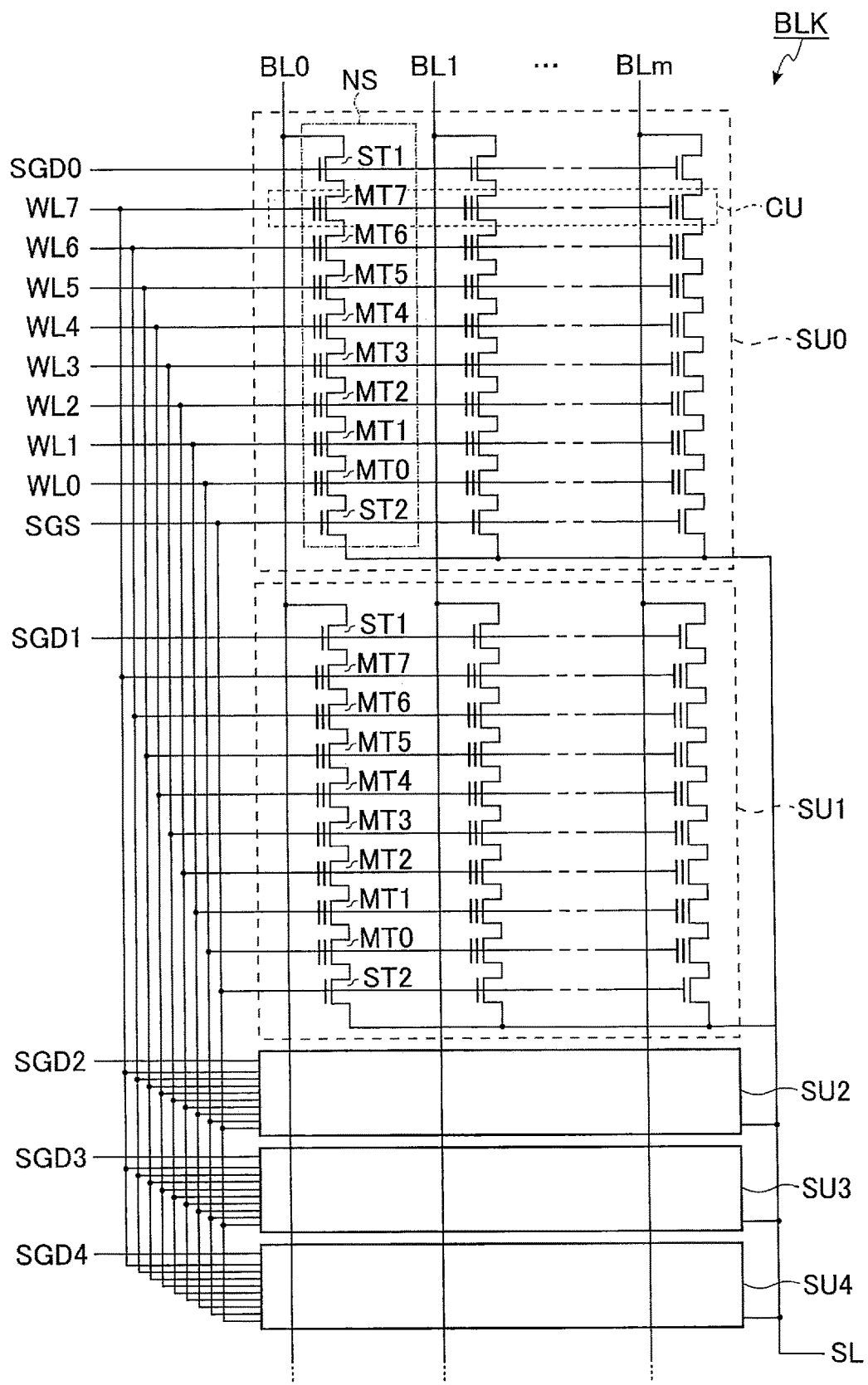
F I G. 2

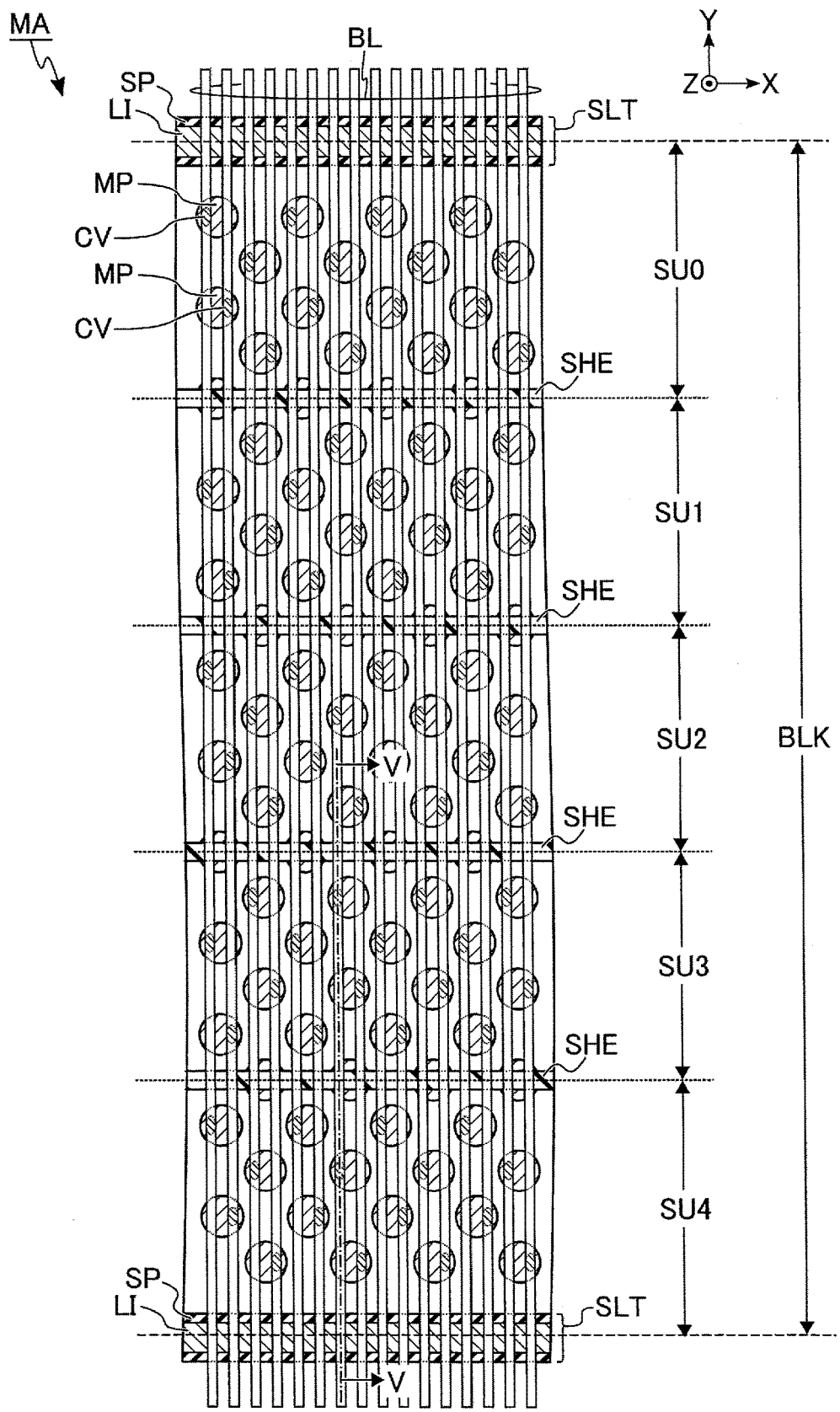
F I G. 4

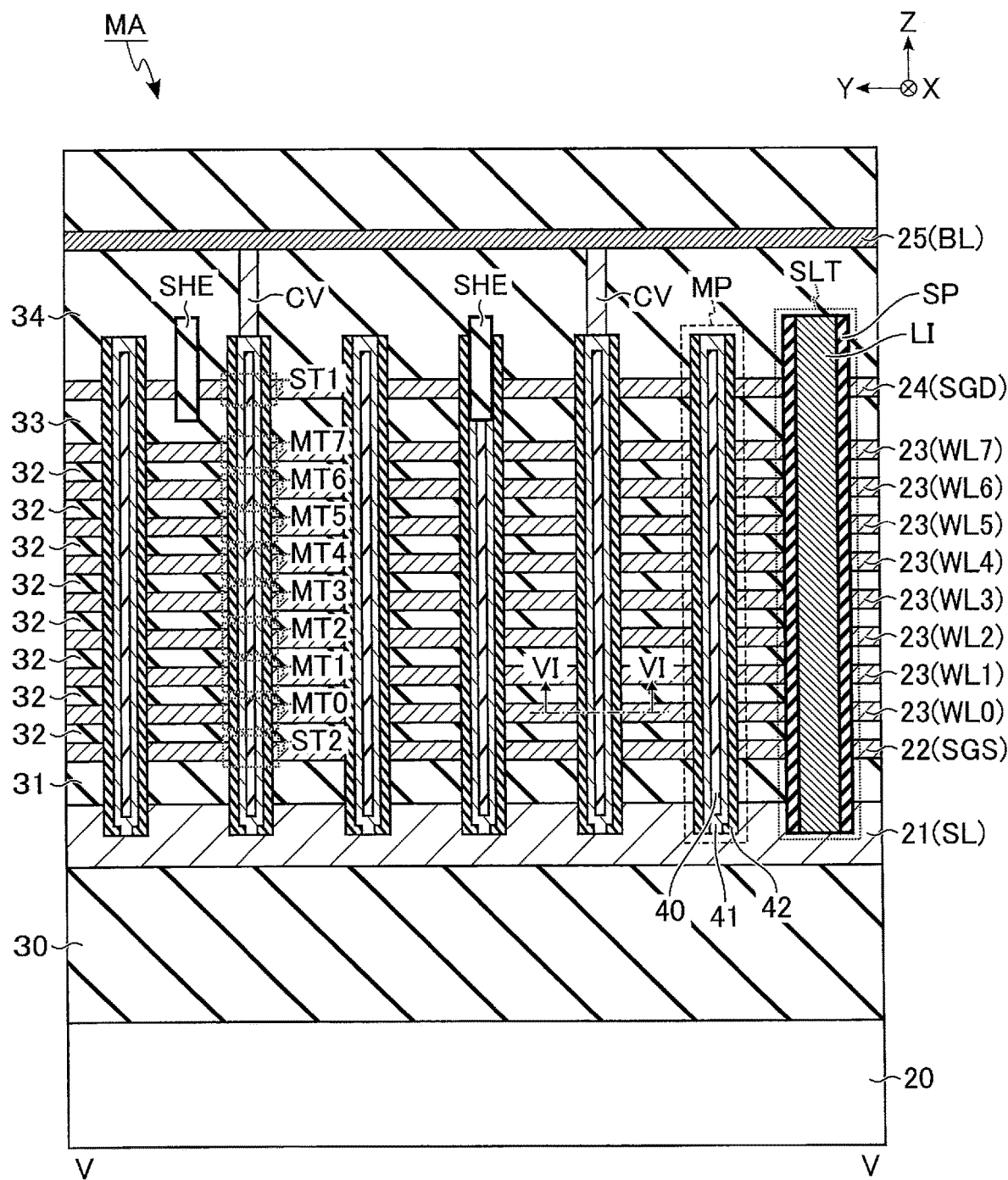
F I G. 5

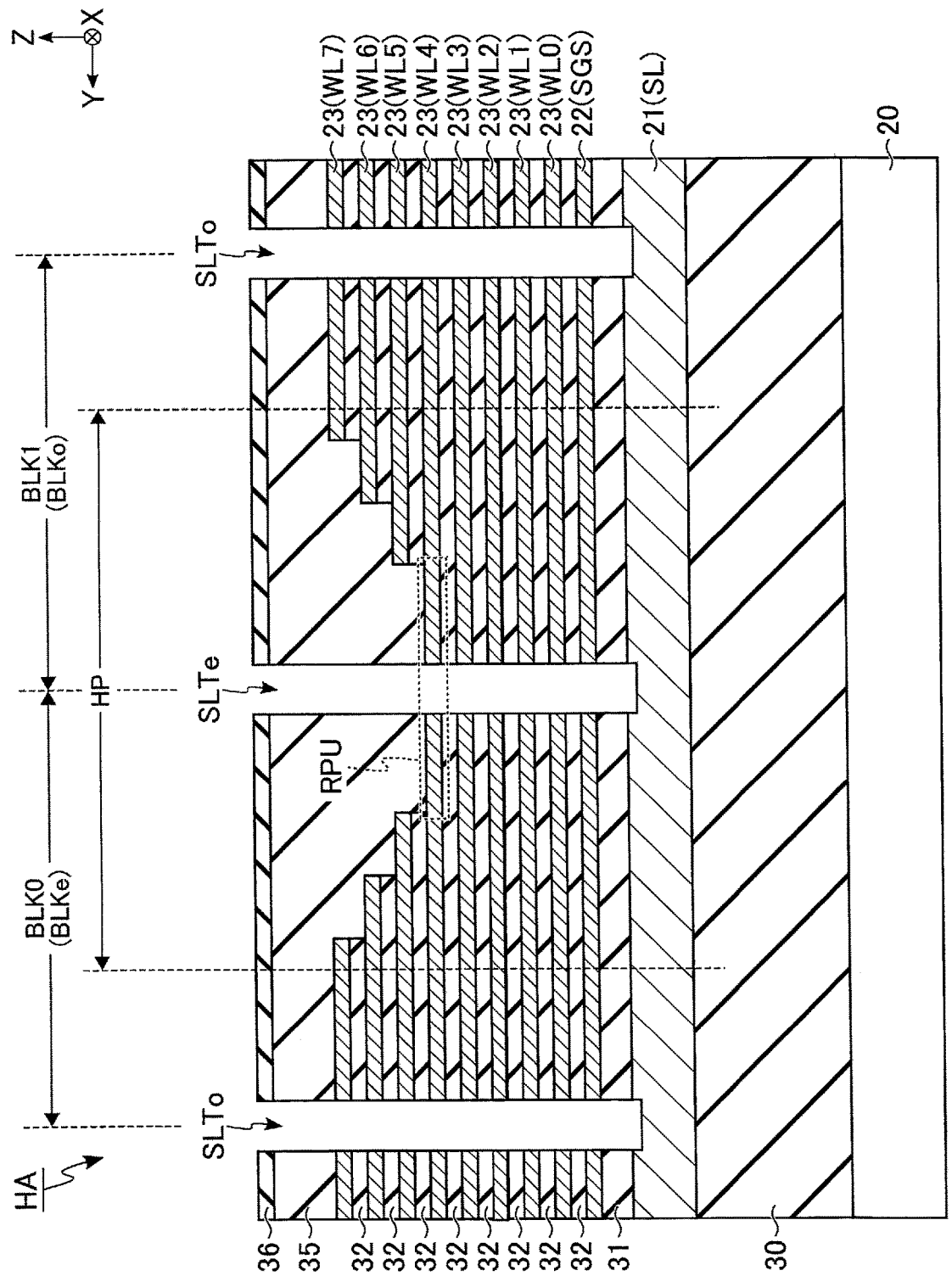
F I G. 23

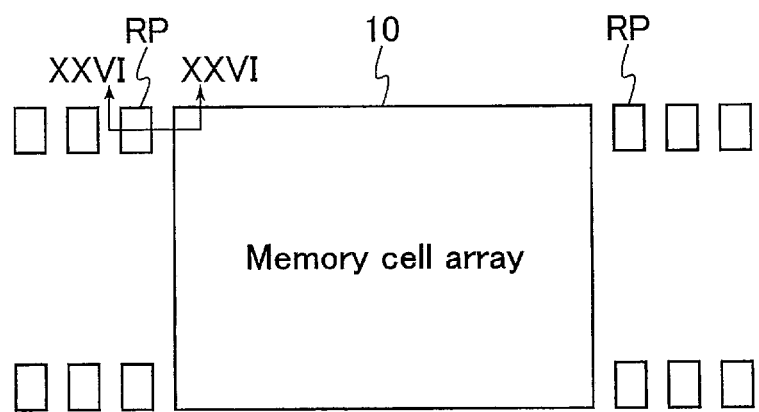
F I G. 25
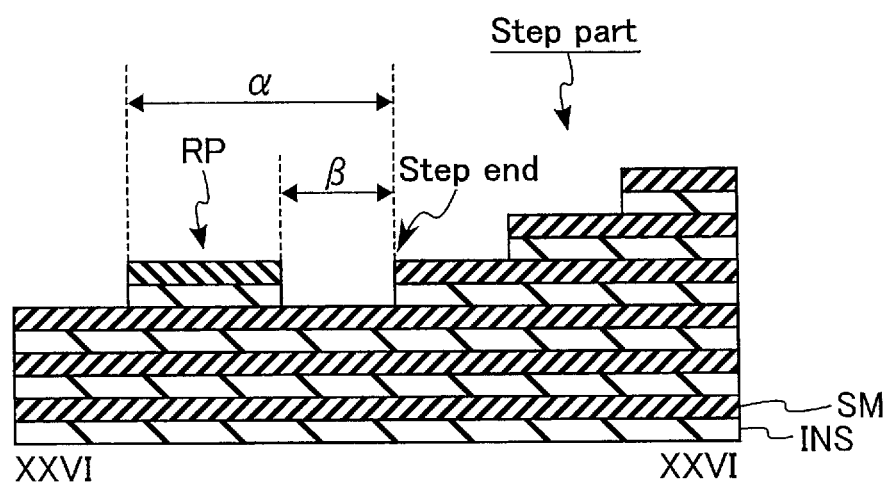
F I G. 26

SEMICONDUCTOR MEMORY DEVICE

CROSS-REFERENCE TO RELATED APPLICATIONS

This application is based upon and claims the benefit of priority from Japanese Patent Application No. 2020-156710, filed Sep. 17, 2020, the entire contents of which are incorporated herein by reference.

FIELD

Embodiments described herein relate generally to a semiconductor memory device.

BACKGROUND

There is known a NAND-type flash memory capable of storing data in a nonvolatile manner.

BRIEF DESCRIPTION OF THE DRAWINGS

FIG. 1 is a block diagram showing an example of an overall configuration of a semiconductor memory device according to an embodiment.

FIG. 2 is a circuit diagram showing an example of a circuit structure of a memory cell array included in the semiconductor memory device according to the embodiment.

FIG. 4 is a plan view showing an example of a detailed planar layout in a memory area of the memory cell array included in the semiconductor memory device according to the embodiment.

FIG. 5 is a cross-sectional view, taken along line V-V in FIG. 4, showing an example of a cross-sectional structure in the memory area of the memory cell array included in the semiconductor memory device according to the embodiment.

FIG. 23 is a cross-sectional view showing an example of a cross-sectional structure in the course of manufacturing of the semiconductor memory device according to the embodiment.

FIG. 25 is a plan view showing an example of a planar layout of a semiconductor memory device according to a comparative example of the embodiment.

FIG. 26 is a cross-sectional view, taken along line XXVI-XXVI in FIG. 25, showing an example of a cross-sectional structure in the course of manufacturing of the semiconductor memory device according to the comparative example of the embodiment.

DETAILED DESCRIPTION

Figure 3:
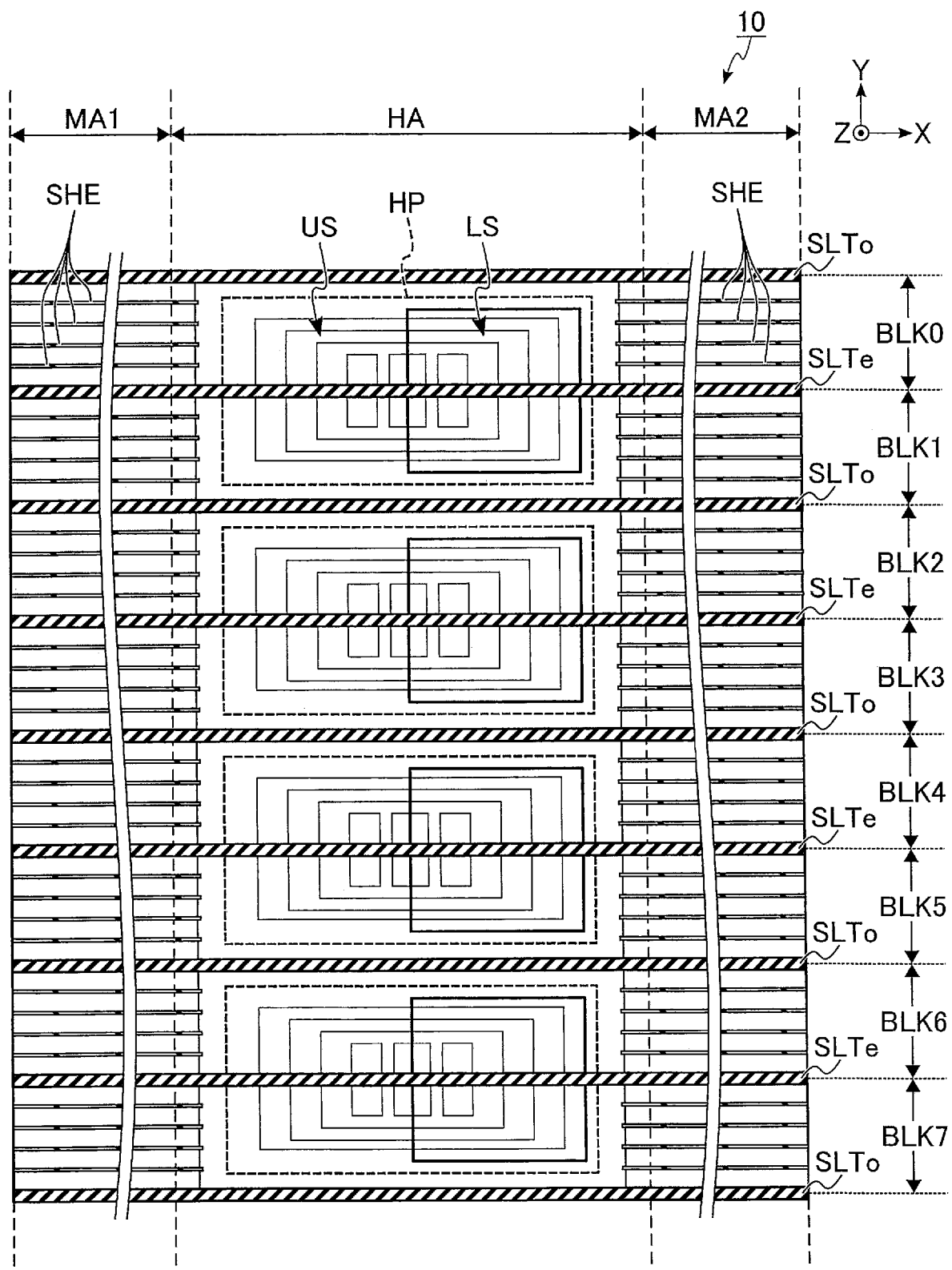
FIG. 3 is a plan view showing an example of a planar layout of the memory cell array included in the semiconductor memory device according to the embodiment.

A semiconductor memory device according to an embodiment includes a substrate, a plurality of conductive layers, a plurality of pillars, and a plurality of contacts. The substrate includes a first area, a second area, and a plurality of block areas. The first area and the second area are arranged in a first direction. Each of the block areas is provided to extend in the first direction. The block areas are arranged in a second direction intersecting the first direction. The conductive layers are divided for each of the block areas. The conductive layers are arranged in a third direction intersecting the first and second directions and provided to be separated from one another. The conductive layers include a plurality of terraced portions. The terraced portions are provided not to overlap an upper conductive layer for each area in which the second area and any one of the block areas overlap. The pillars are provided for each of the block areas. Each of the pillars is provided to penetrate the conductive layers. A portion at which one of the pillars and one of the conductive layers intersect each other functions as a memory cell. The contacts are respectively provided on the terraced portions for each of the block areas. The first area contains at least one of the pillars. The second area includes a first sub area and a second sub area arranged in the first direction. The first sub area includes a first stepped structure. The first stepped structure including a structure in which a plurality of first terraced portions included in the terraced portions ascend or descend along the first direction and in a direction toward the first area. The second sub area includes a second stepped structure and a first pattern, the second stepped structure including a structure in which a plurality of second terraced portions included in the terraced portions ascend or descend along the first direction and in a direction away from the first area. The first pattern is continuous with any one of the conductive layers. The first pattern is arranged between the first stepped structure and the second stepped structure. At least one contact of the contacts is arranged between the first pattern and a terraced portion of a conductive layer continuous with the first pattern.

Embodiments will be described below with reference to the accompanying drawings. Each embodiment exemplifies a device and a method for embodying a technical idea of the invention. The drawings are schematic or conceptual, and the dimensions and ratios, etc. in the drawings are not always the same as those of the actual products. The technical idea of the present invention is not specified by the shapes, structures, arrangements, etc. of the structural elements.

In the following descriptions, structural elements having substantially the same function and configuration will be assigned the same reference symbol. The numbers after the letters that make up the reference signs are used to distinguish between elements referenced by reference signs containing the same characters and that have a similar configuration. When components having reference symbols containing the same letters need not be distinguished from each other, these components may be referred to by a reference symbol containing the letters only.

Embodiment

A semiconductor memory device 1 according to an embodiment will be described below.

[1] Structure of Semiconductor Memory Device 1

[1-1] Overall Structure of Semiconductor Memory Device 1

FIG. 1 shows an exemplary structure of the semiconductor memory device 1 according to the embodiment. The semiconductor memory device 1 is a NAND flash memory capable of storing data in a non-volatile manner, and is controlled by an external memory controller 2. As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of 1 or more). A block BLK is a set of a plurality of memory cells capable of storing data in a nonvolatile manner, and is, for example, used as a unit of erasing data. A plurality of bit lines and word lines are provided in the memory cell array 10. Each memory cell is, for example, associated with one bit line and one word line. The structure of the memory cell array 10 will be described in detail later.

The command register 11 stores a command CMD received by the semiconductor memory device 1 from the memory controller 2. The command CMD includes, for example, an instruction for causing the sequencer 13 to execute a read, write, erase operation, etc.

The address register 12 stores address information ADD received by the semiconductor memory device 1 from the memory controller 2. The address information ADD includes, for example, a block address BAd, a page address PAd, and a column address CAd. For example, the block address BAd, page address PAd, and column address CAd are used for selection of a block BLK, a word line, and a bit line, respectively.

The sequencer 13 controls the overall operation of the semiconductor memory device 1. For example, the sequencer 13 controls the driver module 14, row decoder module 15, and sense amplifier module 1G, etc., based on a command CMD held in the command register 11, to execute the read, write, erase operations, etc.

The driver module 14 generates a voltage to be used for the read, write, and erase operations, etc. The driver module 14 applies the generated voltage to a signal line corresponding to a selected word line, for example, based on a page address PAd held in the address register 12.

The row decoder module 15 selects one corresponding block BLK in the memory cell array 10, based on a block address BAd held in the address register 12. The row decoder module 15, for example, transfers the voltage applied to the signal line corresponding to the selected word line to the selected word line in the selected block BLK.

The sense amplifier module 16 applies a desired voltage to each bit line in a write operation, in accordance with write data DAT received from the memory controller 2. In a read operation, the sense amplifier module 16 determines data stored in a memory cell based on the voltage of the bit line, and transfers the determination result to the memory controller 2 as read data DAT.

The above-described semiconductor memory device 1 and memory controller 2 may be combined into a single semiconductor device. Examples of such semiconductor devices include a memory card such as an SDTM card, and a solid state drive (SSD).

[1-2] Circuit Structure of Memory Cell Array 10

FIG. 2 shows an example of a circuit structure of the memory cell array 10 included in the semiconductor memory device 1 according to the embodiment, focusing on one of the blocks BLK included in the memory cell array 10. As shown in FIG. 2, the block BLK includes, for example, five string units SU0 to SU4.

Each string unit SU includes a plurality of NAND strings NS respectively associated with bit lines BL0 to BLm (where m is an integer of 1 or more). Each NAND string NS includes, for example, memory cell transistors MT0 to MT7 and select transistors ST1 and ST2. Each memory cell transistor MT includes a control gate and a charge storage layer, and stores data in a nonvolatile manner. Each of the select transistors ST1 and ST2 is used for selection of a string unit SU in various operations.

In each NAND string NS, the memory cell transistors MT0 to MT7 are coupled in series. The drain of the select transistor ST1 is coupled to an associated bit line BL. The source of the select transistor ST1 is coupled to one end of a serial connection of memory cell transistors MT0 to MT7. The drain of the select transistor ST2 is coupled to the other end of the serial connection of memory cell transistors MT0 to MT7. The source of the select transistor ST2 is coupled to a source line SL.

Within a block BLK, the control gates of sets of memory cell transistors MT0 to MT7 are coupled to word lines WL0 to WL7, respectively. The gates of a plurality of select transistors ST1 in the string unit SU0 are coupled to a select gate line SGD0. The gates of a plurality of select transistors ST1 in the string unit SU1 are coupled to a select gate line SGD1. The gates of a plurality of select transistors ST1 in the string unit SU2 are coupled to a select gate line SGD2. The gates of a plurality of select transistors ST1 in the string unit SU3 are coupled to a select gate line SGD3. The gates of a plurality of select transistors ST1 in the string unit SU4 are coupled to a select gate line SGD4. The gates of a plurality of select transistors ST2 are coupled to a select gate line SGS.

Different column addresses are respectively assigned to the bit lines BL0 to BLm. Each bit line BL is shared by the NAND strings NS, to which the same column address is assigned, among a plurality of blocks BLK. A set of word lines WL0 to WL7 is provided for each block BLK. The source line SL is, for example, shared among a plurality of blocks BLK.

A set of memory cell transistors MT coupled to a common word line WL in one string unit SU is referred to as, for example, a "cell unit CU". For example, the storage capacity of a cell unit CU including the memory cell transistors MT, each of which stores 1-bit data, is defined as "1-page data". The cell unit CU can have a storage capacity of 2-page data or more in accordance with the number of bits of data stored in the memory cell transistors MT.

The circuit structure of the memory cell array 10 included in the semiconductor memory device 1 according to the embodiment is not limited to the above-described structure. The number of string units SU included in each block BLK and the number of memory cell transistors MT and select transistors ST1 and ST2 included in each NAND string NS may be any number.

[1-3] Structure of Memory Cell Array 10

An exemplary structure of the memory cell array 10 included in the semiconductor memory device 1 according to the embodiment will be described below. In the drawings to be referred to hereinafter, a direction in which the word lines WL extend is referred to as an "X direction", a direction in which the bit lines BL extend is referred to as a "Y direction", and a direction vertical to the surface of a semiconductor substrate 20 used for formation of the semiconductor memory device 1 is referred to as a "Z direction". In the plan views, hatching is added as appropriate to facilitate visualization of the drawings. The hatching added to the plan views, however, may not necessarily relate to the materials or properties of the hatched structural components. In the cross-sectional views, some structures are omitted as appropriate to facilitate visualization of the drawings. The components shown in each drawing may be simplified as appropriate.

[1-3-1] Planar Layout of Memory Cell Array 10

FIG. 3 shows an example of a planar layout of the memory cell array 10 included in the semiconductor memory device 1 according to the embodiment, focusing on an area corresponding to eight blocks BLK0 to BLK7. As shown in FIG. 3, the memory cell array 10 includes a plurality of slits SLT and a plurality of slits SHE. The planar layout of the memory cell array 10 is, for example, divided into memory areas MA1 and MA2 and a hookup area HA in the X direction. Each of the memory areas MA1 and MA2 is an area including a plurality of NAND strings NS and used for data storage. The hookup area HA is an area arranged between the memory areas MA1 and MA2 and provided with contacts for stacked interconnects of the memory cell array 10, etc.

The slits SLT, each of which includes a portion that extends along the X direction, are aligned in the Y direction. Each of the slits SLT extends across the memory areas MA1 and MA2 and the hookup area HA in the X direction. The slit SLT has, for example, a structure in which an insulator and a plate-shaped contact are embedded inside, and divides interconnects (e.g., the word lines WL0 to WL7 and the select gate lines SGD and SGS) that are adjacent to each other via the slit SLT. In this example, each of the areas sectioned by the slits SLT corresponds to one block BLK. In the present specification, among the slits SLT aligned in the Y direction, an odd-numbered slit SLT is referred to as "SLTo", and an even-numbered slit SLT is referred to as "SLTe".

The slits SHE are arranged in each of the memory areas MA1 and MA2. The slits SHE corresponding to the memory area MA1 are provided across the memory area MA1, and are aligned in the Y direction. The slits SHE corresponding to the memory area MA2 are provided across the memory area MA2, and are arranged in the Y direction. In this example, four slits SHE are arranged between any adjacent slits SLT. Each slit SHE has a structure into which an insulator is embedded. The slit SHE divides interconnects that are adjacent to each other via the slit SHE, and divides at least the select gate lines SGD. In this example, each of the areas sectioned by the slits SLT and SHE corresponds to one string unit SU.

The hookup area HA includes a plurality of hookup parts HP aligned in the Y direction. Each hookup part HP is arranged for every two blocks BLK. In other words, within the hookup area HA, each hookup part HP is arranged in a region sandwiched between two slits SLTo adjacent to each other in the Y direction, and divided by one slit SLTe. Each hookup part HP includes contact areas US and LS aligned in the X direction. The contact area US includes a stepped structure corresponding to interconnects arranged on the upper layer side among the stacked interconnects. The contact area LS includes a stepped structure corresponding to interconnects arranged on the lower layer side among the stacked interconnects.

For example, the contact areas US included in the hookup area HA are aligned in the Y direction. Similarly, the contact areas LS included in the hookup area HA are aligned in the Y direction. The structure is not limited thereto, and in two adjacent hookup parts HP, the contact area US of one hookup part HP and the contact area LS in the other hookup part HP may be adjacent to each other in the Y direction. In other words, in the hookup area HA, the contact areas US and LS may be arranged alternately in the Y direction.

The stacked interconnects run around the hookup part HP, and are electrically coupled in an area opposite to a boundary of a set of two block areas in the Y direction, between the memory areas MA1 and MA2. Specifically, in the block BLK0, the hookup part HP is arranged closer to the block BLK1 side, and the stacked interconnects within the memory areas MA1 and MA2 are continuously provided between the slit SLTo adjacent to the block BLK0 and the hookup part HP. On the other hand, in the block BLK1, the hookup part HP is arranged closer to the block BLK0 side, and the stacked interconnects within the memory areas MA1 and MA2 are continuously provided between the slit. SLTo adjacent to the block BLK1 and the hookup part HP.

In the memory cell array 10, the layout shown in FIG. 3 is repeatedly arranged in the Y direction. The planar layout of the memory cell array 10 included in the semiconductor memory device 1 according to the embodiment is not limited to the above-described layout. For example, the number of slits SHE arranged between any adjacent slits SLT may be freely designed. The number of string units SU formed between any adjacent slits SLT may be changed based on the number of slits SHE arranged between the adjacent slits SLT. In each of the memory areas MA and the hookup area HA, an area including a contact penetrating the stacked interconnects may be provided.

[1-3-2] Structure of Memory Cell Array 10 in Memory Area MA (Planar Layout of Memory Cell Array 10 in Memory Area MA)

FIG. 4 shows an example of a detailed planar layout of the memory cell array 10, in the memory area MA, included in the semiconductor memory device 1 according to the embodiment, focusing on an area including one block BLK (i.e., string units SU0 to SU4). As shown in FIG. 4, the memory cell array 10 includes a plurality of memory pillars MP, a plurality of contacts CV, and a plurality of bit lines BL, in the memory area MA. In addition, each slit SLT includes a contact LI and a spacer SP.

Each memory pillar MP functions as, for example, a single NAND string NS. The memory pillars MP are in, for example, a 24-row staggered arrangement in an area between two adjacent slits SLT. For example, a single slit SHE overlaps each set of the memory pillars MP in the fifth row, the tenth row, the fifteenth row, and the twentieth row, counting from the upper side of the drawing.

The bit lines BL, each of which includes a portion that extends in the Y direction, are aligned in the X direction. Each bit line BL is arranged so as to overlap at least one memory pillar MP in each string unit SU. In this example, one memory pillar MP is overlapped with two bit lines BL. One of a plurality of bit lines BL that overlap a memory pillar MP and the memory pillar MP are electrically coupled via a contact CV.

For example, a contact CV is omitted between a memory pillar MP in contact with a slit SHE and a bit line BL. In other words, a contact CV is omitted between a memory pillar MP in contact with two different select gate lines SGD and a bit line BL. The numbers and arrangements of memory pillars MP, slits SHE, etc. provided between any two adjacent slits SLT are not limited to the structure explained with reference to FIG. 4, and can be changed as appropriate. The number of bit lines BL that overlap each memory pillar MP can be freely designed.

The contact LI is a conductor including a portion that extends in the X direction. The spacer SP is an insulator provided on a side surface of the contact LI. The contact LI is sandwiched by the spacers SP. The contact LI and a conductor (e.g., the word lines WL0 to WL7, and the select gate lines SOD and SGS) adjacent to the contact LI in the Y direction are distanced and insulated by the spacer SP.

(Cross-Sectional Structure of Memory Cell Array 10 in Memory Area MA)

FIG. 5 shows an example of a cross-sectional structure of the memory cell array 10, in the memory area MA, included in the semiconductor memory device 1 according to the embodiment, focusing on a cross section taken along line V-V in FIG. 4. As shown in FIG. 5, the memory cell array 10 further includes a semiconductor substrate 20, conductive layers 21 to 25, and insulating layers 30 to 34.

Specifically, the insulating layer 30 is provided on the semiconductor substrate 20. Although illustration is omitted, the insulating layer 30 includes, for example, circuitry corresponding to the row decoder module 15, the sense amplifier module 16, etc.

The conductive layer 21 is provided on the insulating layer 30. The conductive layer 21 is formed into, for example, a plate shape expanding along the XY plane, and is used as the source line SL. The conductive layer 21 contains, for example, phosphorous-doped silicon.

The insulating layer 31 is provided on the conductive layer 21. The conductive layer 22 is provided on the insulating layer 31. The conductive layer 22 is formed into, for example, a plate shape expanding along the XY plane, and is used as a select gate line SGS. The conductive layer 22 contains, for example, tungsten.

The insulating layers 32 and the conductive layers 23 are alternately stacked on the conductive layer 22. The conductive layers 23 are each formed into, for example, a plate shape expanding along the XY plane. A plurality of stacked conductive layers 23 are used as the word lines WL0 to WL7, respectively, in order from the semiconductor substrate 20 side. The conductive layers 23 contain, for example, tungsten.

The insulating layer 33 is provided on the uppermost conductive layer 23. The conductive layer 24 is provided on the insulating layer 33. The conductive layer 24 is formed into, for example, a plate shape extending along the XY plane, and is used as a select gate line SGD. The conductive layer 24 contains, for example, tungsten.

The insulating layer 34 is provided on the conductive layer 24. The conductive layer 25 is provided on the insulating layer 34. The conductive layer 25 is formed into, for example, a linear shape extending in the Y direction, and is used as a bit line BL. Namely, the plurality of conductive layers 25 are arranged along the X direction in an unillustrated area. The conductive layer 25 contains, for example, copper.

Each of the memory pillars MP extends in the Z direction, penetrating the insulating layers 31 to 33 and the conductive layers 22 to 24. A bottom portion of the memory pillar MP is in contact with the conductive layer 21. A portion at which the memory pillar MP and the conductive layer 22 intersect each other functions as a select transistor ST2. A portion at which the memory pillar MP and one conductive layer 23 intersect each other functions as one memory cell transistor MT. A portion at which the memory pillar MP and the conductive layer 24 intersect each other functions as a select transistor ST1.

In addition, each of the memory pillars MP includes, for example, a core member 40, a semiconductor layer 41, and a stacked film 42. The core member 40 extends in the Z direction. For example, a top end of the core member 40 is included in a layer above the conductive layer 24, and a bottom end of the core member 40 reaches the conductive layer 21. The semiconductor layer 41 surrounds the core member 40. Part of the semiconductor layer 41 is in contact with the conductive layer 21 at a lower portion of the memory pillar MP. The stacked film 42 covers the side and bottom surfaces of the semiconductor layer 41, excluding the portion at which the semiconductor layer 41 is in contact with the conductive layer 21. The core member 40 includes, for example, an insulator such as silicon oxide. The semiconductor layer 41 contains, for example, silicon.

A pillar-shaped contact CV is provided on the semiconductor layer 41 in the memory pillar MP. In the illustrated area, two contacts CV, respectively corresponding to two of the six memory pillars MP, are shown. In the memory area MA, to a memory pillar MP which does not overlap the slit SHE and to which a contact CV is not coupled, a contact CV is coupled in an unillustrated area.

A single conductive layer 25, i.e., a single bit line BL, is in contact with the upper surface of the contact CV. In each space sectioned by the slits SLT and SHE, one contact CV is coupled to the single conductive layer 25. That is, the memory pillar MP arranged between any adjacent slits SLT and SHE and the memory pillar MP arranged between any two adjacent slits SHE are electrically coupled to each conductive layer 25.

The slit SLT includes, for example, a portion provided along the XZ plane, and divides the conductive layers 22 to 24. In the slit SLT, the contact LI is provided along the slit SLT. A part of a top end of the contact LI is in contact with the insulating layer 34. A bottom end of the contact LI is in contact with the conductive layer 21. The contact LI is used as, for example, a part of the source line SL. The spacer SP is provided at least between the contact LI and the conductive layers 22 to 24. The contact LI and the conductive layers 22 to 24 are distanced and insulated by the spacer SP.

The slit SHE includes, for example, a portion provided along the XZ plane, and divides at least the conductive layer 24. A top end of the slit SHE is in contact with the insulating layer 34. A bottom end of the slit SHE is in contact with the insulating layer 33. The slit SHE includes, for example, an insulator such as silicon oxide. The top end of the slit SHE may be designed to be aligned or unaligned with a top end of the slit SLT. In addition, the top end of the slit SHE may be designed to be aligned or unaligned with a top end of the memory pillar MP.

Figure 6:
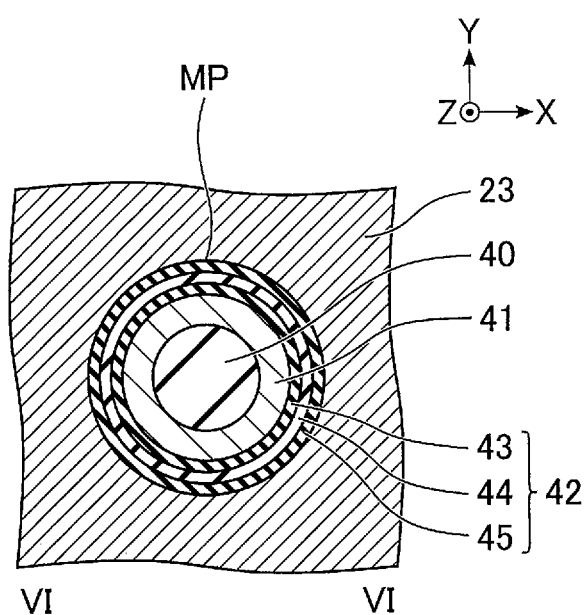
FIG. 6 is a cross-sectional view, taken along line VI-VI in FIG. 5, showing an example of a cross-sectional structure of a memory pillar in the semiconductor memory device according to the embodiment.

FIG. 6 shows a cross section taken along line VI-VI in FIG. 5 as an example of a cross-sectional structure of the memory pillar MP in the semiconductor memory device 1 according to the embodiment. More specifically, FIG. 6 shows a cross-sectional structure of the memory pillar MP in a layer that is parallel to the surface of the semiconductor substrate 20 and includes the conductive layer 23. As shown in FIG. 6, the stacked film 42 includes, for example, a tunnel insulating film 43, an insulating film 44, and a block insulating film 45.

In the cross section including the conductor layer 23, the core member 40 is provided in the middle of the memory pillar MP. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 45 surrounds the side surface of the insulating film 44. The conductive layer 23 surrounds the side surface of the block insulating film 45. Each of the tunnel insulating film 43 and the block insulating film 45 contains, for example, silicon oxide. The insulating film 44 contains, for example, silicon nitride.

In the above-described memory pillar MP, the semiconductor layer 41 is used as a channel (current path) for the memory cell transistors MT0 to MT7 and the select transistors ST1 and ST2. The insulating film 44 is used as a charge storage layer of the memory cell transistors MT. The semiconductor memory device 1 can pass an electric current through the memory pillar MP between the bit line BL and the contact LI by turning on the memory cell transistors MT0 to MT7 and the select transistors ST1 and ST2.

[1-3-3] Structure of Memory Cell Array 10 in Hookup Area HA

A structure of the memory cell array 10, in the hookup area HA, included in the semiconductor memory device 1 according to the embodiment will be described below. In the following, an even-numbered block BLK is referred to as "BLKe", and an odd-numbered block BLK is referred to as "BLKo".

(Planar Layout of Memory Cell Array 10 in Hookup Area HA)

Figure 7:
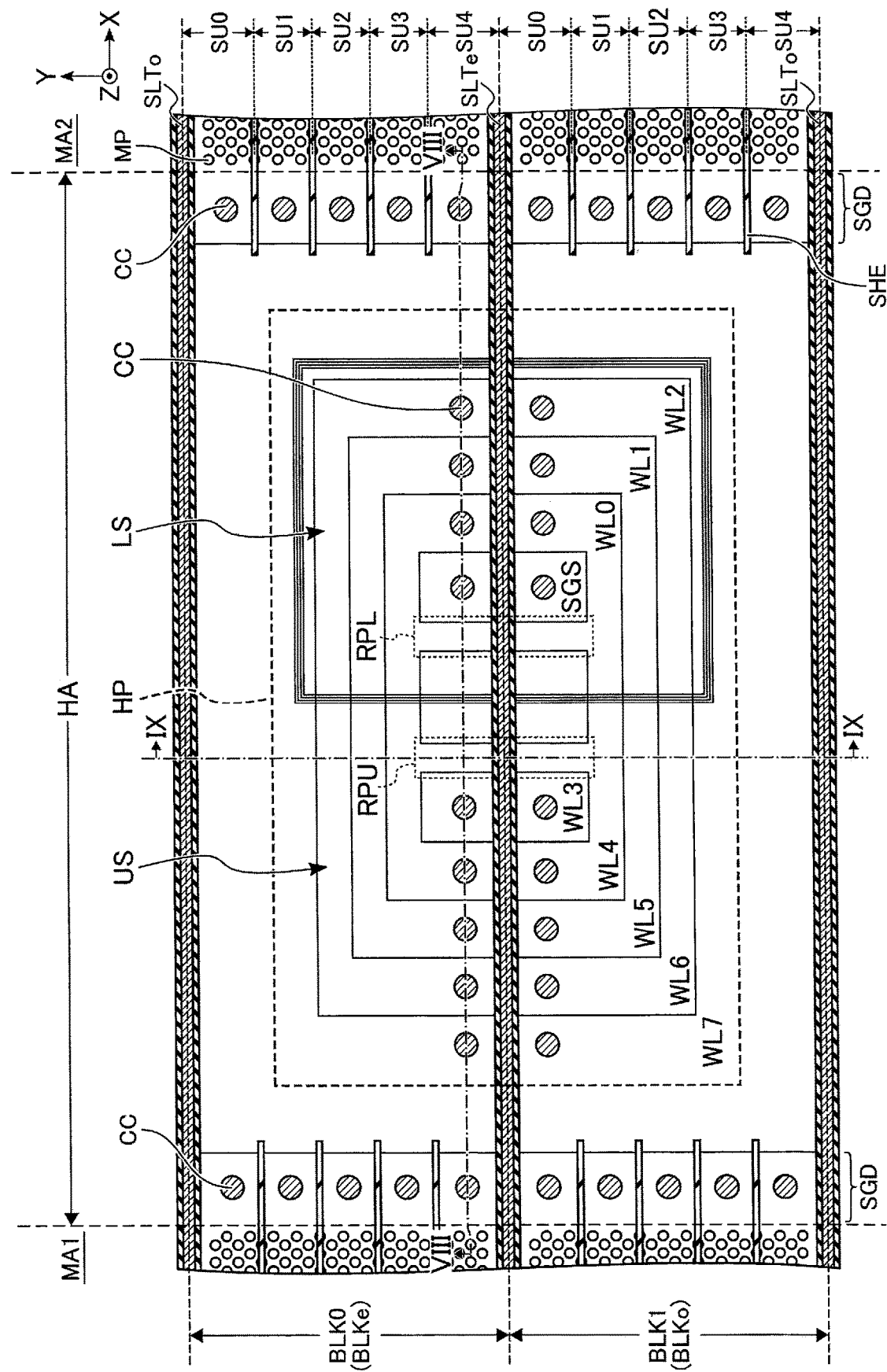
FIG. 7 is a plan view showing an example of a detailed planar layout in a hookup area of the memory cell array included in the semiconductor memory device according to the embodiment.

FIG. 7 shows an example of a detailed planar layout of the memory cell array 10, in the hookup area HA, included in the semiconductor memory device 1 according to the embodiment, focusing on an area corresponding to adjacent blocks BLK0 (BLKe) and BLK1 (BLKo). In addition, FIG. 7 also shows a part of the memory areas MA1 and MA2 in the vicinity of the hookup area HA. As shown in FIG. 7, in the hookup area HA, each of the select gate line SGS, word lines WL0 to WL7, and select gate line SGD includes a portion (terraced portion) that is not covered by the upper interconnect layers (conductive layers).

The shape of the portion not covered by the upper interconnect layers in the hookup area HA resembles a step, terrace, rimstone, etc. Specifically, level differences are respectively provided between the select gate line SGS and word line WL0, between the word lines WL0 and WL1, . . . , between the word lines WL6 and WL7, and between the word line WL7 and select gate line SGD. The hookup part HP includes the terraced portions of the select gate line SGS and word lines WL0 to WL7.

Specifically, the contact area LS includes a plurality of terraced portions corresponding to the select gate line SGS and word lines WL0 to WL2 arranged on the lower layer side among the stacked interconnects. The contact area US includes a plurality of terraced portions corresponding to the word lines WL3 to WL7 arranged on the upper layer side among the stacked interconnects. These terraced portions are then aligned in the order of the word lines WL7, WL6, WLS, WL4, WL3, select gate line SGS, word lines WL0, WL1, and WL2 along the X direction.

That is, in the contact area US, a stepped structure formed by the terraced portions of the word lines WL7, WL6, WL5, WL4, and WL3 among the stacked interconnects has a structure ascending along the X direction and in a direction toward the memory area MA1. In other words, in the contact area US, the stepped structure formed by the terraced portions of the word lines WL7, WL6, WL5, WL4, and WL3 among the stacked interconnects has a structure descending along the X direction and in a direction toward the memory area MA2. On the other hand, in the contact area LS, a stepped structure formed by the terraced portions of the select gate line SGS and word lines WL0, WL1, and WL2 among the stacked interconnects has a structure ascending along the X direction and in a direction toward the memory area MA2. In other words, in the contact area LS, a stepped structure formed by the terraced portions of the select gate line SGS and word lines WL0, WL1, and WL2 among the stacked interconnects has a structure descending along the X direction and in a direction toward the memory area MA1.

In addition, in the hookup area HA, the memory cell array 10 includes a plurality of contacts CC. Within each block BLK, the contacts CC are respectively provided on the terraced portions of the select gate line SGS, word lines WL0 to WL7, and select gate lines SGD0 to SGD4. The contacts CC provided in the hookup part HP and in an area of one of the blocks BLK are arranged in a straight line, for example. These contacts are not necessarily arranged in a straight line, but may be arranged to be offset vertically from one another.

Each of the stacked interconnects coupled to the NAND string NS is electrically coupled to the row decoder module 15 via an associated contact CC. The contact CC and the row decoder module 15 may be coupled either via a contact penetrating the stacked interconnects within the hookup area HA or via a contact provided in an area outside the memory cell array 10. An area with a contact penetrating the stacked interconnects may be provided within the memory area MA. The contact CC within the hookup part HP and the contact outside the hookup part HP may be coupled to the row decoder module 15 via paths which differ from each other.

In this example, the contacts CC are arranged at level difference portions (stepped portions) aligned in the X direction of the stacked interconnects provided in the hookup part HP. The stacked interconnects provided in the hookup part HP have level differences also in the Y direction. In such a portion, referred to as a "dummy stepped structure," the contacts CC are, for example, not arranged. The dummy stepped structure is a structure collaterally formed in a manufacturing process of the semiconductor memory device 1. For example, a portion corresponding to the block BLK0 (BLKe) and a portion corresponding to the block BLK1 (BLKo) in the hookup part HP have, for example, a structure symmetrical in the Y direction with reference to the slit SLTe.

Furthermore, in the semiconductor memory device 1 according to the embodiment, the contact area US includes a reference pattern RPU, and the contact area LS includes a reference pattern RPL. The reference pattern RPU and the reference pattern RPL are adjacent to each other in the X direction. The reference pattern RPU is used for management of a position of the stepped structure provided in the contact area US in the manufacturing process of the semiconductor memory device 1. The reference pattern RPL is used for management of a position of the stepped structure provided in the contact area LS in the manufacturing process of the semiconductor memory device 1. Each of the reference patterns RPU and RPL is divided by the slit SLTe dividing the hookup part HP near the middle in the Y direction.

The reference pattern RPU is provided in any one of the interconnects in layers above the lowermost interconnect forming the stepped structure (e.g., word line WL3) in the contact area US. In this example, the word line WL4 includes the reference pattern RPU. In this case, in each block BLK, the contact CC coupled to the lowermost interconnect in the contact area US is surrounded by the terraced portion of the word line WL4, the reference pattern RPU continuous with the terraced portion of the word line WL4, and the slit SLTe dividing the hookup part HP. In other words, at least one contact CC is arranged between the terraced portion of the word line WL4 and the reference pattern RPU.

The reference pattern RPL is provided in any one of the interconnects in layers above the lowermost interconnect forming the stepped structure (e.g., select gate line SGS) in the contact area LS. In this example, the word line WL0 includes the reference pattern RPL. In this case, in each block BLK, the contact CC coupled to the lowermost interconnect in the contact area LS is surrounded by the terraced portion of the word line WL0, the reference pattern RPL continuous with the terraced portion of the word line WL0, and the slit SLTe dividing the hookup part HP. In other words, at least one contact CC is arranged between the terraced portion of the word line WL0 and the reference pattern RPL.

Within the contact area US, a portion sandwiched between the reference pattern RPU and the interconnects in layers above the lowermost interconnect forming the stepped structure in the contact area US corresponds to the terraced portion of the lowermost interconnect (e.g., word line WL3) in the contact area US. Within the contact area LS, a portion sandwiched between the reference pattern RPL and the interconnects in layers above the lowermost interconnect forming the stepped structure in the contact area LS corresponds to the terraced portion of the lowermost interconnect (e.g., select gate line SGS) in the contact area LS. A boundary portion between the contact areas US and LS is arranged away from each of the reference patterns RPU and RPL, and extends across an area between the reference patterns RPU and RPL.

(Cross-Sectional Structure of Memory Cell Array 10 in Hookup Area HA)

Figure 8:
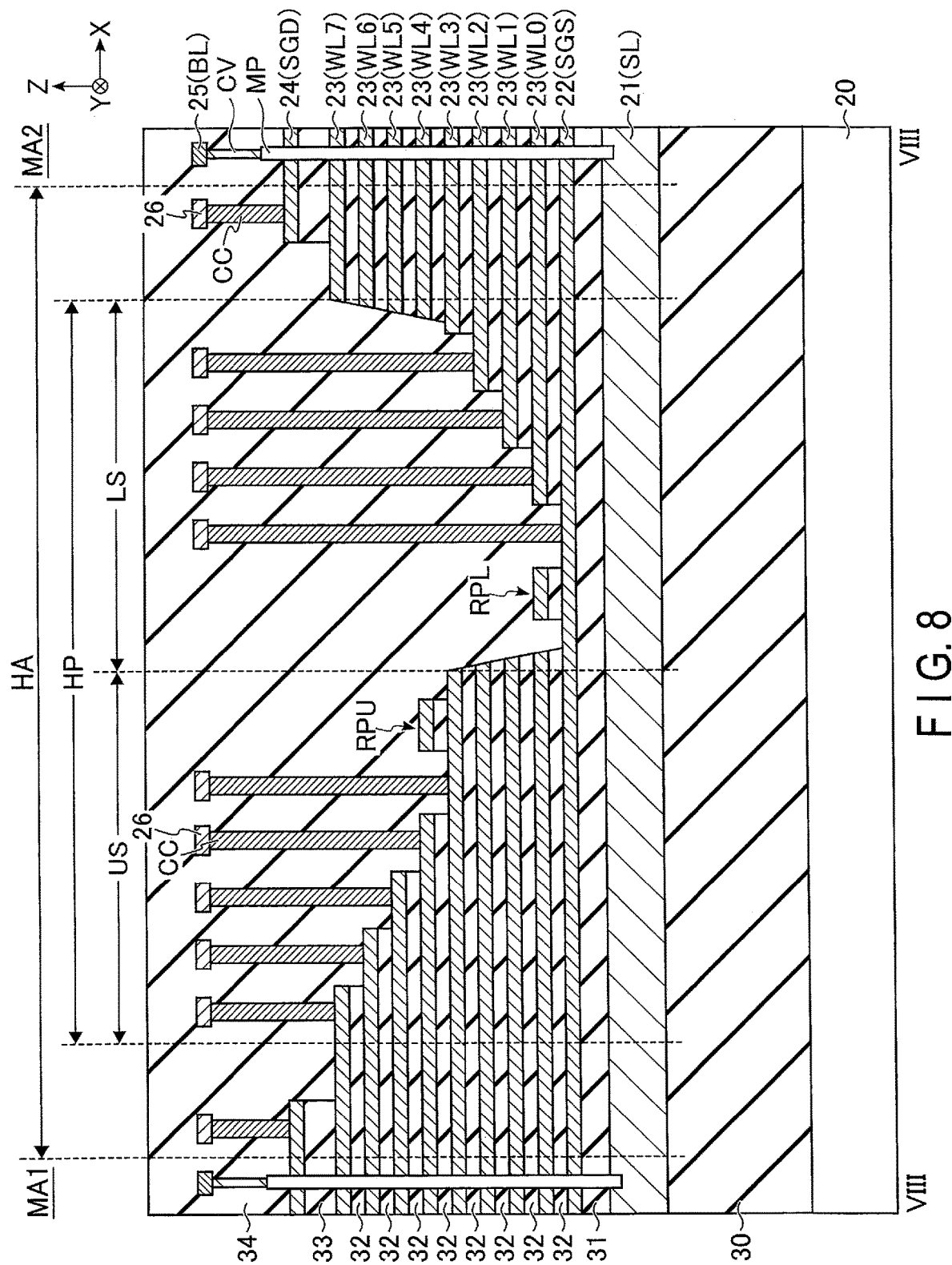
FIG. 8 is a cross-sectional view, taken along line VIII-VIII in FIG. 7, showing an example of a cross-sectional structure in the hookup area of the memory cell array in the semiconductor memory device according to the embodiment.

FIG. 8 is a cross-sectional view, taken along line VIII-VIII in FIG. 7, showing an example of a cross-sectional structure of the memory cell array 10, in the hookup area HA, included in the semiconductor memory device 1 according to the embodiment. In addition, FIG. 8 also shows a part of the memory areas MA1 and MA2 in the vicinity of the hookup area HA. As shown in FIG. 8, in the hookup area HA, end portions of the conductive layers 22 to 24 corresponding to the word lines WL and select gate lines SGD and SGS are provided in a staircase pattern.

Specifically, the contact area US includes the stepped structure corresponding to the word lines WL3 to WL7. The contact area LS includes the stepped structure corresponding to the select gate line SGS and word lines WL0 to WL2. The stepped structure provided in the contact area US and the stepped structure provided in the contact area LS have, for example, a structure symmetrical in the X direction but are of different heights. The height of the stepped structure within the contact area US is greater than that of the stepped structure within the contact area. LS. In this example, the stepped structure within the contact area LS has a structure of lower height than the stepped structure within the contact area US by four sets of the insulating layer 32 and the conductive layer 23.

In addition, in the hookup area HA, the memory cell array 10 includes a plurality of conductive layers 26. The contacts CC are provided on the respective terraced portions of the select gate line SGS, word lines WL0 to WL7, and select gate line SGD. One conductive layer 26 is provided on each contact CC. Thereby, each of the conductive layers 22 and 24 and the associated conductive layer 26 are electrically coupled via the contact CC. The conductive layers 26 are included in, for example, a layer having the same height as that of the conductive layer 25.

A tapered shape of a stacked structure including the word lines WL0 to WL3 arranged at the boundary portion between the contact areas US and LS is similar to a tapered shape of a stacked structure including the word lines WL4 to WL7 provided on the memory area MA2 side of the contact area LS. This is because in the manufacturing process of the semiconductor memory device 1, etching for four sets of the conductive layer 23 and the insulating layer 32 is collectively performed for the contact area LS. This processing will be described in detail later. In the following, the stepped structure provided in the contact area US is also referred to as an "upper-side step part", and the stepped structure provided in the contact area LS is also referred to as a "lower-side step part".

Figure 9:
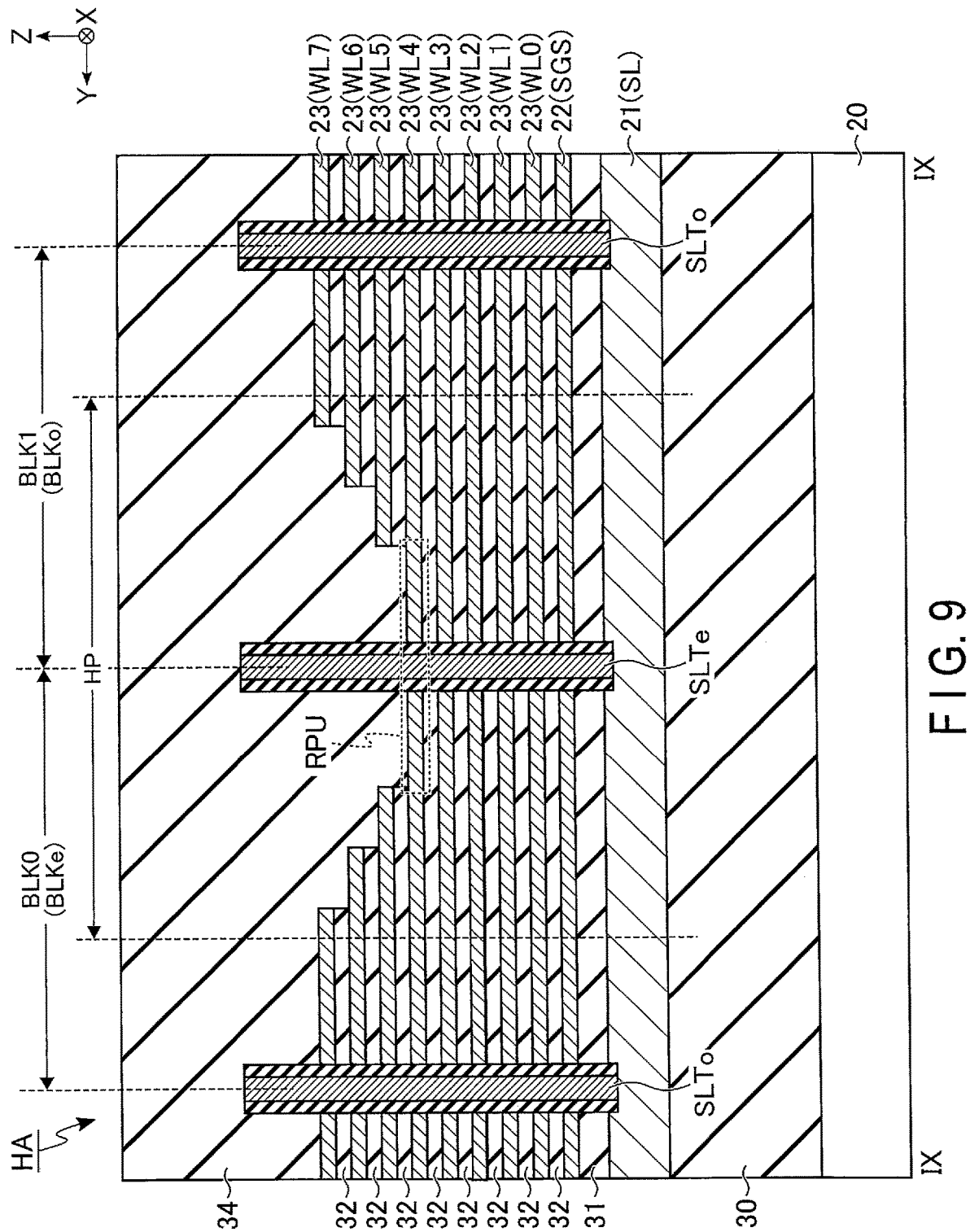
FIG. 9 is a cross-sectional view, taken along line IX-IX in FIG. 7, showing an example of a cross-section structure in the hookup area of the memory cell array in the semiconductor memory device according to the embodiment.

FIG. 9 is a cross-sectional view, taken along line IX-IX in FIG. 7, showing an example of a cross-sectional structure of the memory cell array 10, in the hookup area HA, included in the semiconductor memory device 1 according to the embodiment. In addition, FIG. 9 includes the reference pattern RPU of the contact area US. As shown in FIG. 9, in the hookup part HP, the memory cell array 10 has a stepped structure ascending to both sides in the Y direction.

Specifically, in an area corresponding to the block BLK0 (BLKe), the stacked conductive layers 23 have a stepped structure ascending toward the slit SLTo to which the block BLK0 is adjacent. Similarly, in an area corresponding to the block BLK1 (BLKo), the stacked conductive layers 23 have a stepped structure ascending toward the slit SLTo to which the block BLK1 is adjacent. Then, the stepped structure in the Y direction in the area corresponding to the block BLK0 and the stepped structure in the Y direction in the area corresponding to the block BLK1 have a structure symmetrical in the Y direction.

The slit SLTe between the blocks BLK0 and BLK1 divides the conductive layers 22 and 23 in the hookup part HP. In addition, the slit SLTe also divides the reference pattern RPU. That is, the reference pattern RPU includes a portion continuous with the conductive layer 23, corresponding to the word line WL4 within the block BLK0, and a portion continuous with the conductive layer 23, corresponding to the word line WL4 within the block BLK1. Similarly, although illustration is omitted, the reference pattern RPL includes a portion continuous with the conductive layer 23 corresponding to the word line WL0 within the block BLK0 and a portion continuous with the conductive layer 23 corresponding to the word line WL0 within the block BLK1.

In addition, in this example, a width of the terraced portion in the Y direction in the stepped structure in the Y direction is approximately equal to that of the terraced portion in the X direction in the stepped structure in the X direction. For example, a width of the terraced portion of the word line WL5 in the Y direction that is drawn in the Y direction is approximately equal to that of the terraced portion of the word line WL5 in the X direction that is drawn in the X direction. In the semiconductor memory device 1 according to the embodiment, the stepped structure formed in the hookup part HP may be other structures. The memory cell array 10 may include the reference patterns RPU and RPL at least in the hookup part HP.

[2] Manufacturing Method of Semiconductor Memory Device 1

Figure 10:
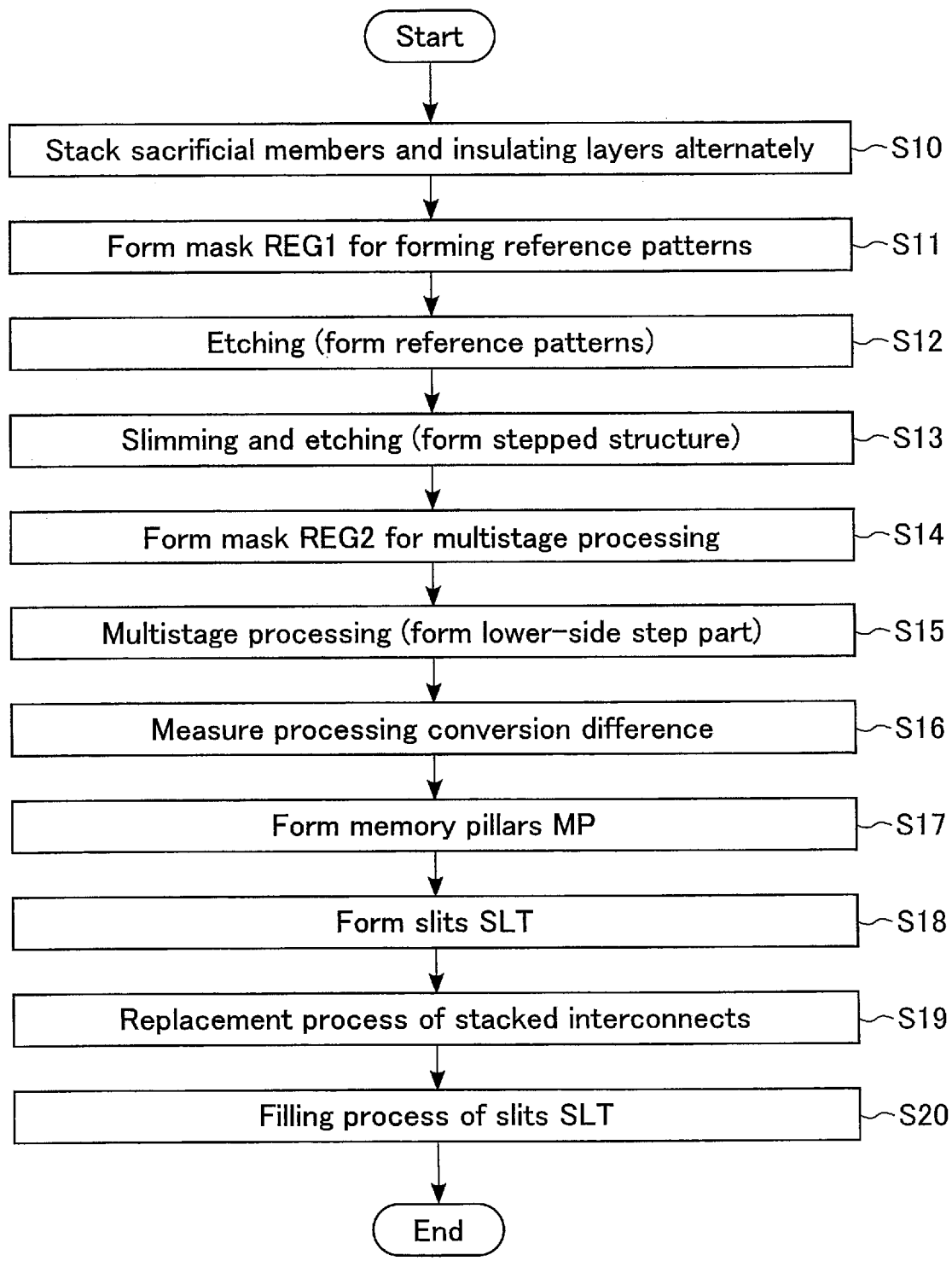
FIG. 10 is a flowchart showing an example of a manufacturing method of the semiconductor memory device according to the embodiment.

FIG. 10 shows an example of a flowchart of a manufacturing method of the semiconductor memory device 1 according to the embodiment. FIGS. 11 to 24 each show an example of a planar layout or a cross-sectional structure in the course of manufacturing of the semiconductor memory device 1 according to the embodiment. The plan views used for explanation of the manufacturing method show the same area as that of FIG. 7. The cross-sectional views used for explanation of the manufacturing method show the same area as that of FIG. 8 or 9. In the following, an example of a manufacturing process relating to formation of the stacked interconnects of the memory cell array 10 in the semiconductor memory device 1 according to the embodiment will be described with reference to FIG. 10 as needed. As shown in FIG. 10, in the manufacturing process of the semiconductor memory device 1 according to the embodiment, the processes of steps S10 to S20 are sequentially performed.

Figure 11:
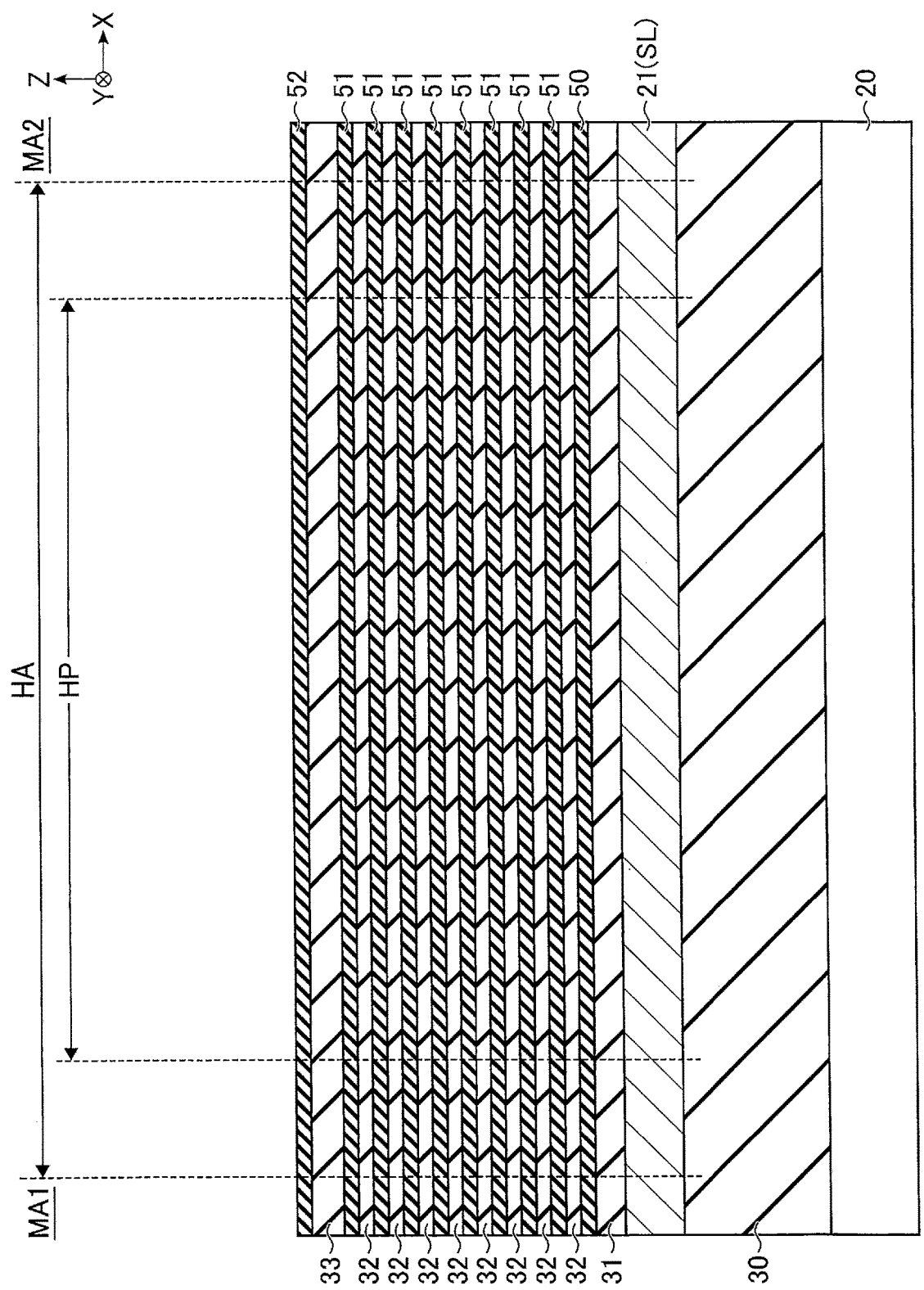
FIG. 11 is a cross-sectional view showing an example of a cross-sectional structure in the course of manufacturing the manufacture of the semiconductor memory device according to the embodiment.

In the process of step S10, as shown in FIG. 11, sacrificial members and insulating layers are alternately stacked. Simply speaking, the insulating layer 30 including circuitry (not shown) corresponding to the row decoder module 15, etc. is formed on the semiconductor substrate 20. Then, the conductive layer 21 is formed on the insulating layer 30. The insulating layer 31 and a sacrificial member 50 are formed on the insulating layer 21 in order. Sacrificial members 51 and the insulating layers 32 are alternately formed on the sacrificial member 50. The insulating layer 33 and a sacrificial member 52 are formed on the uppermost sacrificial member 51 in order. The sacrificial member 50 is associated with the select gate line SGS. The sacrificial members 51 are associated with the word lines WL. The sacrificial member 52 is associated with the select gate line SGD. In this example, after the process of step S10, a part of each of the insulating layer 33 and the sacrificial member 52 is removed within the hookup area HA.

Figure 12:
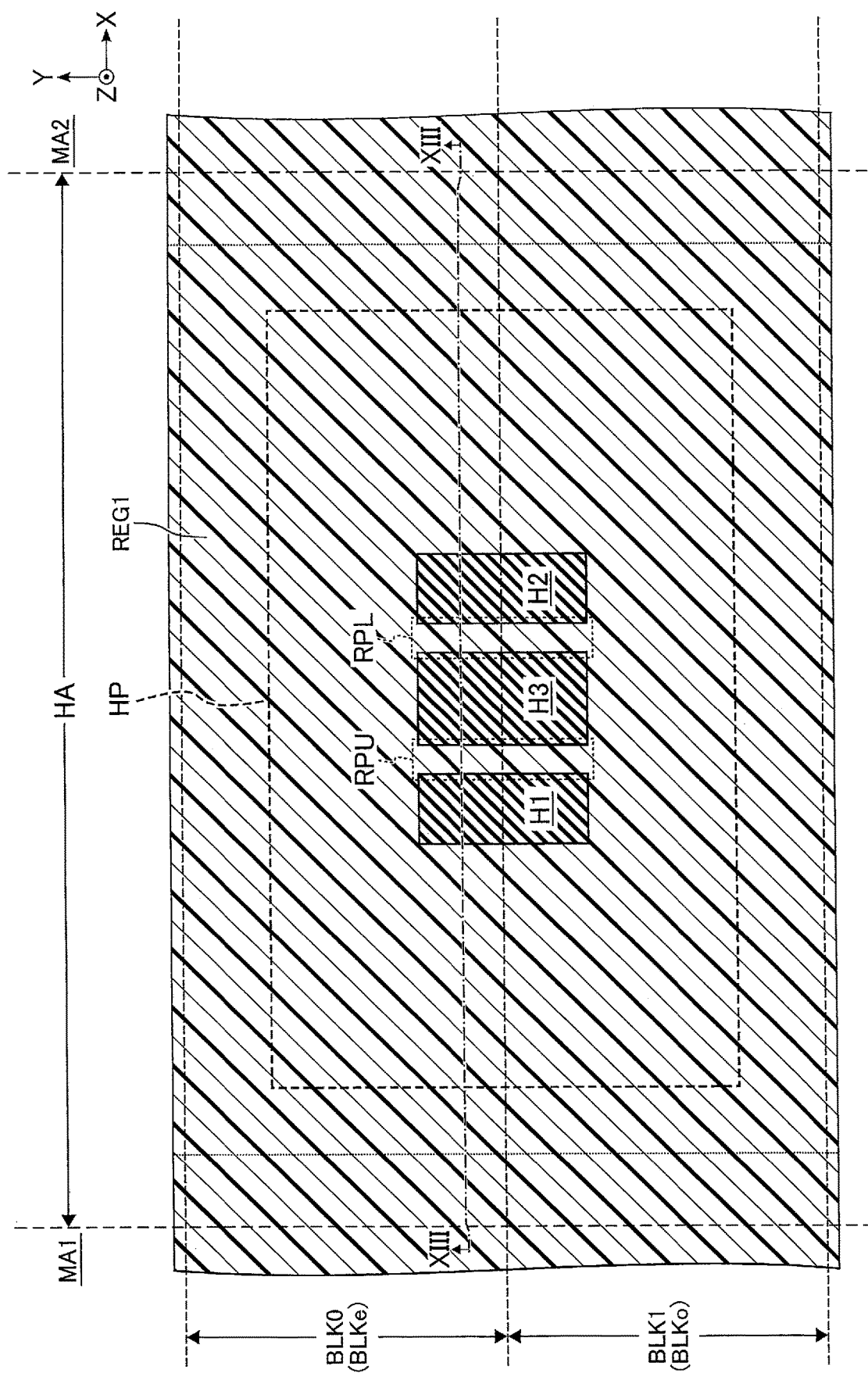
FIG. 12 is a plan view showing an example of a planar layout in the course of manufacturing of the semiconductor memory device according to the embodiment.
Figure 13:
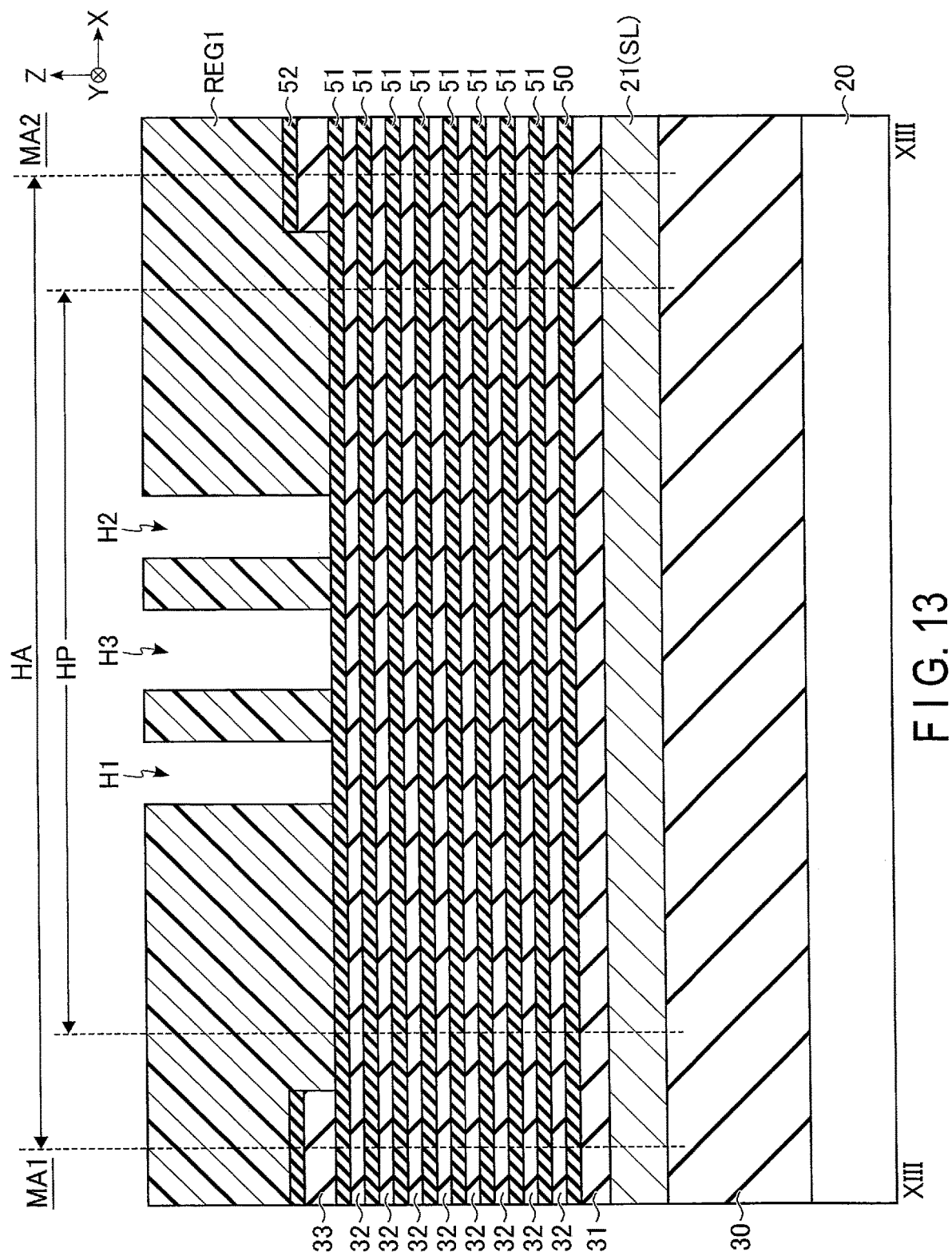
FIG. 13 is a cross-sectional view, taken along line XIII-XIII in FIG. 12, showing an example of a cross-sectional structure in the course of manufacturing of the semiconductor memory device according to the embodiment.

In the process of step S11, as shown in FIG. 12, the mask REG1 for forming the reference patterns is formed. The mask REG1 includes openings H1, H2, and H3 that are separated from one another. The opening H1 overlaps an area in which a terraced portion (e.g., the terraced portion of the word line WL3) of the lowermost conductive layer is formed in the upper-side step part. The opening H2 overlaps an area in which a terraced portion (e.g., the terraced portion of the select gate line SGS) of the lowermost conductive layer is formed in the lower-side step part. The opening H3 is arranged between the openings H1 and H2 and between the areas in which reference patterns RPU and RPL are respectively formed. Each of a width of the mask REG1 in the X direction between the openings H1 and H3 and a width of the mask REG1 in the X direction between the openings H2 and H3 is designed to be equal to or less than double the width of the terraced portion of the conductive layer 23 in the X direction. At a bottom portion of each of the openings H1, H2, and H3, as shown in FIG. 13, a top surface of the uppermost sacrificial member 51 is exposed.

Figure 14:
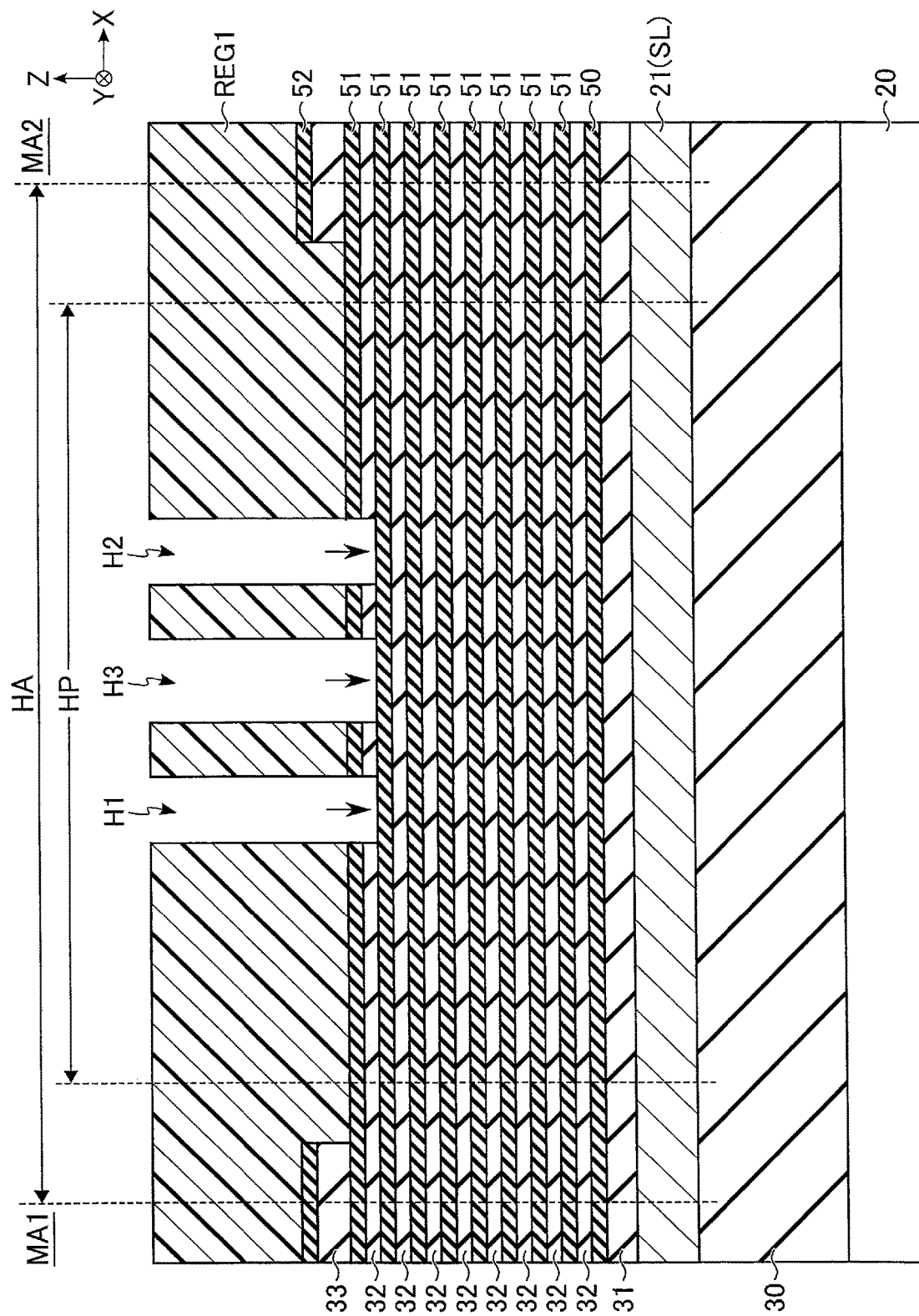
FIG. 14 is a cross-sectional view showing an example of a cross-sectional structure in the course of manufacturing of the semiconductor memory device according to the embodiment.
Figure 15:
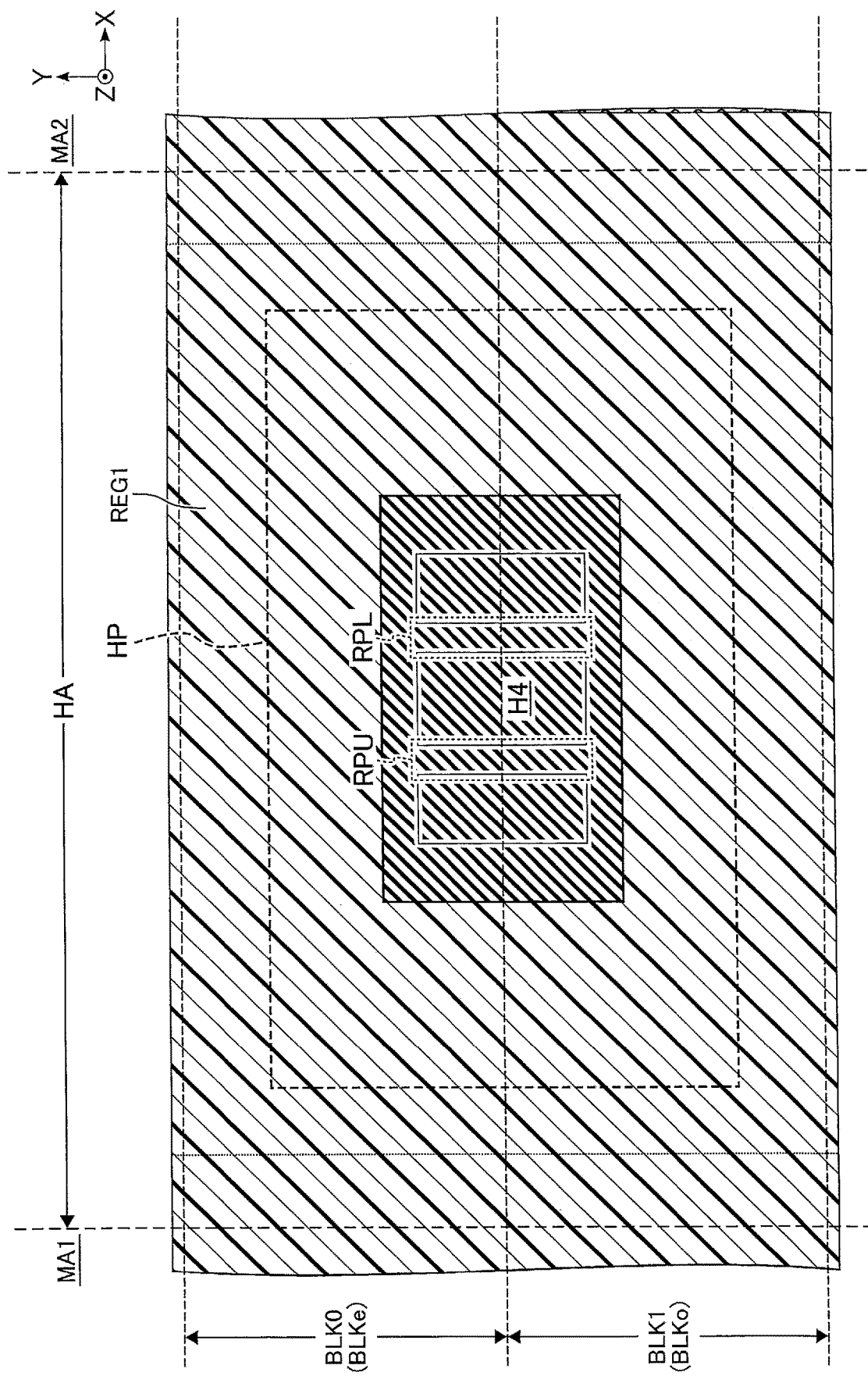
FIG. 15 is a plan view showing an example of a planar layout in the course of manufacturing of the semiconductor memory device according to the embodiment.

In the process of step S12, as shown in FIG. 14, convex portions for forming the reference patterns are formed by etching using the mask REG1. This etching is, for example, reactive ion etching (RIE), and has an anisotropy. In this etching, for example, one set of the sacrificial member 51 and the insulating layer 32 is removed. The convex portion provided between the openings H1 and H3 corresponds to the reference pattern RPU. The convex portion provided between the openings H2 and H3 corresponds to the reference pattern RPL.

Figure 16:
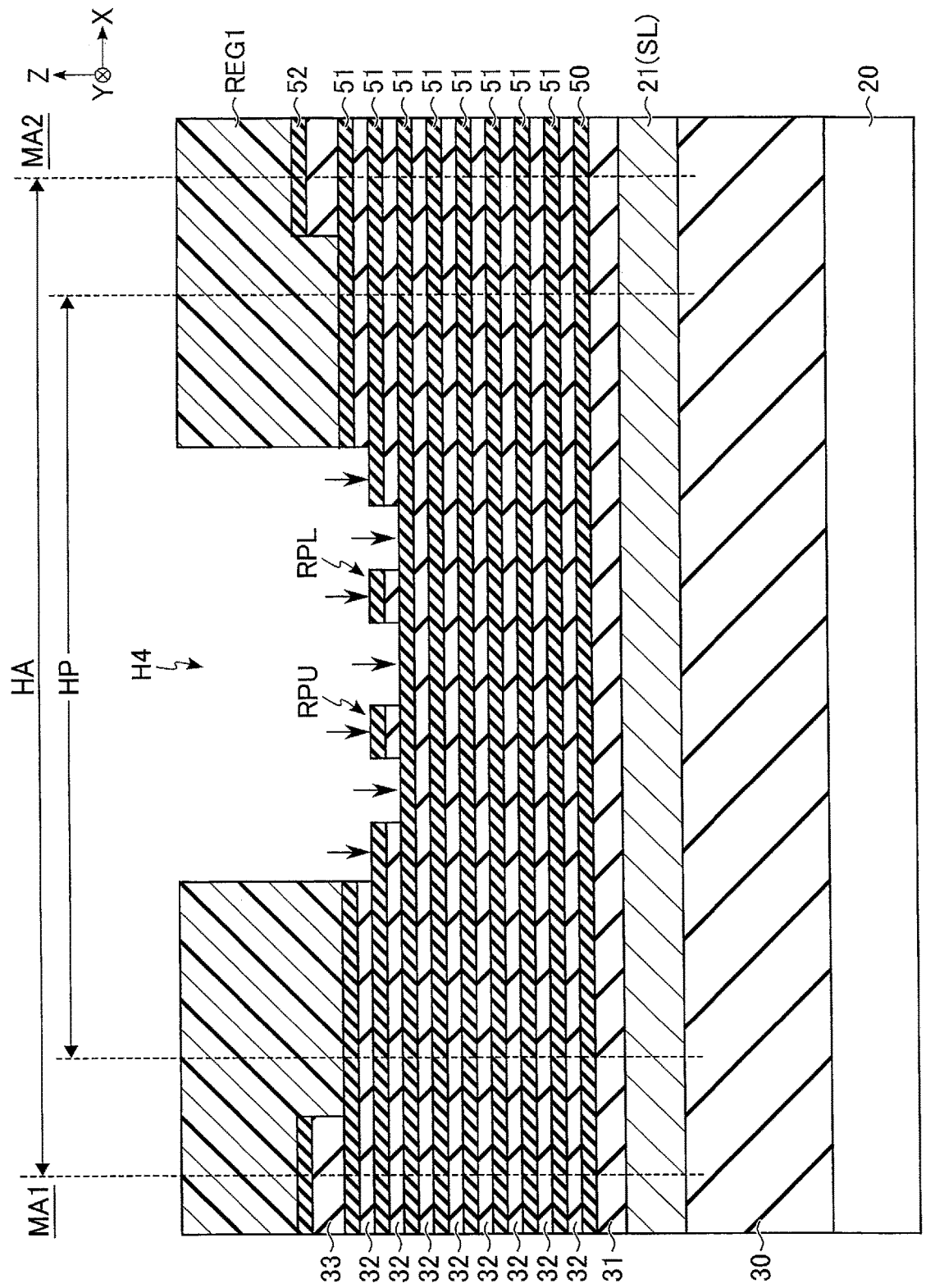
FIG. 16 is a cross-sectional view showing an example of a cross-sectional structure in the course of manufacturing of the semiconductor memory device according to the embodiment.
Figure 17:
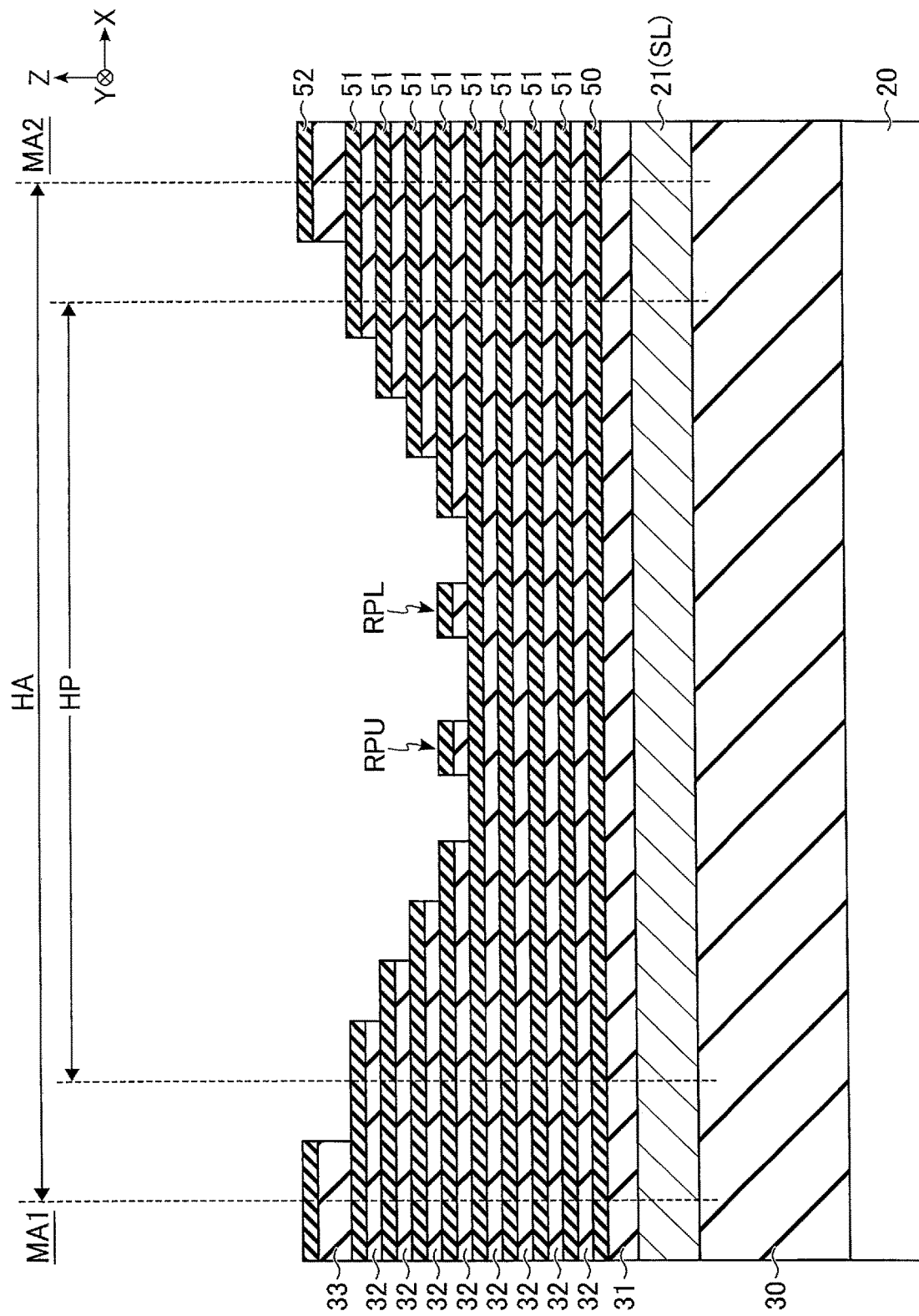
FIG. 17 is a cross-sectional view showing an example of a cross-sectional structure in the course of manufacturing of the semiconductor memory device according to the embodiment.

In the process of step S13, the stepped structure is formed by repeating slimming and etching. Specifically, slimming is first executed upon the mask REG1 so as to process it into a shape shown in FIG. 15. In the slimming process, isotropic etching is performed with a high selectivity setting for a material used in the mask REG1. In addition, such slimming is performed so that etching in a plane direction proceeds by a width of one terraced portion. As a result, the openings H1, H2, and H3 are integrated so that one large opening H4 is formed. Then, by anisotropic etching using the mask REG1, the set of the sacrificial member 51 and the insulating layer 32 is removed so that a structure shown in FIG. 16 is formed. When such slimming and etching are repeatedly performed, a structure shown in FIG. 17 is formed. After a structure corresponding to the upper-side step part is completed, the mask REG1 is removed.

Figure 18:
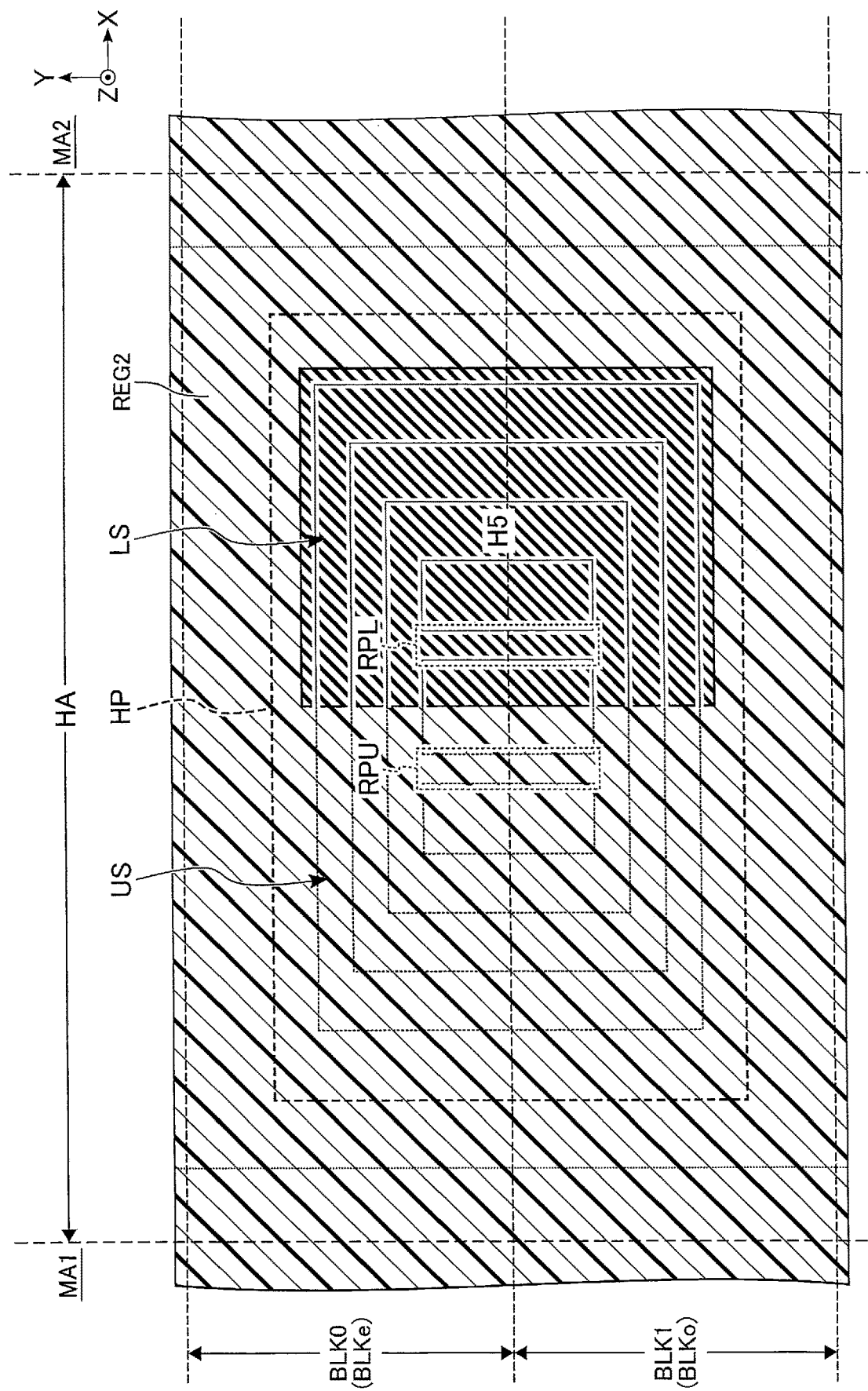
FIG. 18 is a plan view showing an example of a planar layout in the course of manufacturing of the semiconductor memory device according to the embodiment.

In the process of step S14, as shown in FIG. 18, a mask REG2 for multistage processing is formed. The mask REG2 includes an opening H5. The opening H5 overlaps an area corresponding to the contact area LS. That is, the opening H5 overlaps a portion corresponding to the reference pattern RPL. On the other hand, the mask REG2 covers an area corresponding to the contact area US including the reference pattern RPU within the hookup part HP.

Figure 19:
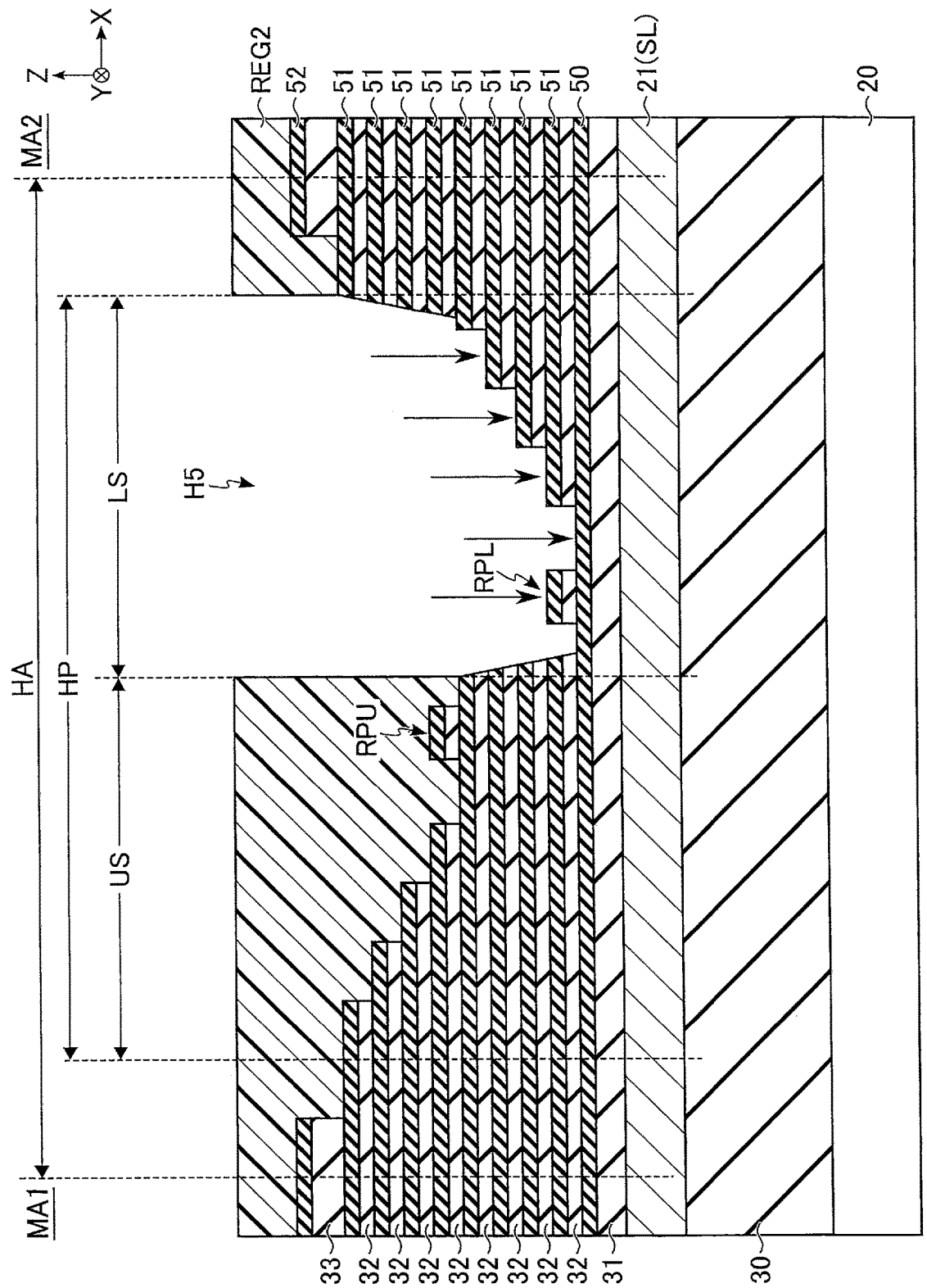
FIG. 19 is a cross-sectional view showing an example of a cross-sectional structure in the course of manufacturing of the semiconductor memory device according to the embodiment.

In the process of step S15, as shown in FIG. 19, the lower-side step part is formed by the multistage processing using the mask REG2. The "multistage processing" indicates the processing for removal of a plurality of sets of the sacrificial member 51 and the insulating layer 32 by anisotropic etching. In this example, etching for four sets of the sacrificial member 51 and the insulating layer 32 is performed using the mask REG2. Thereby, structures corresponding to the lower-side step part and the reference pattern RPL are formed within the contact area LS. Thereafter, the mask REG2 is removed.

Figure 20:
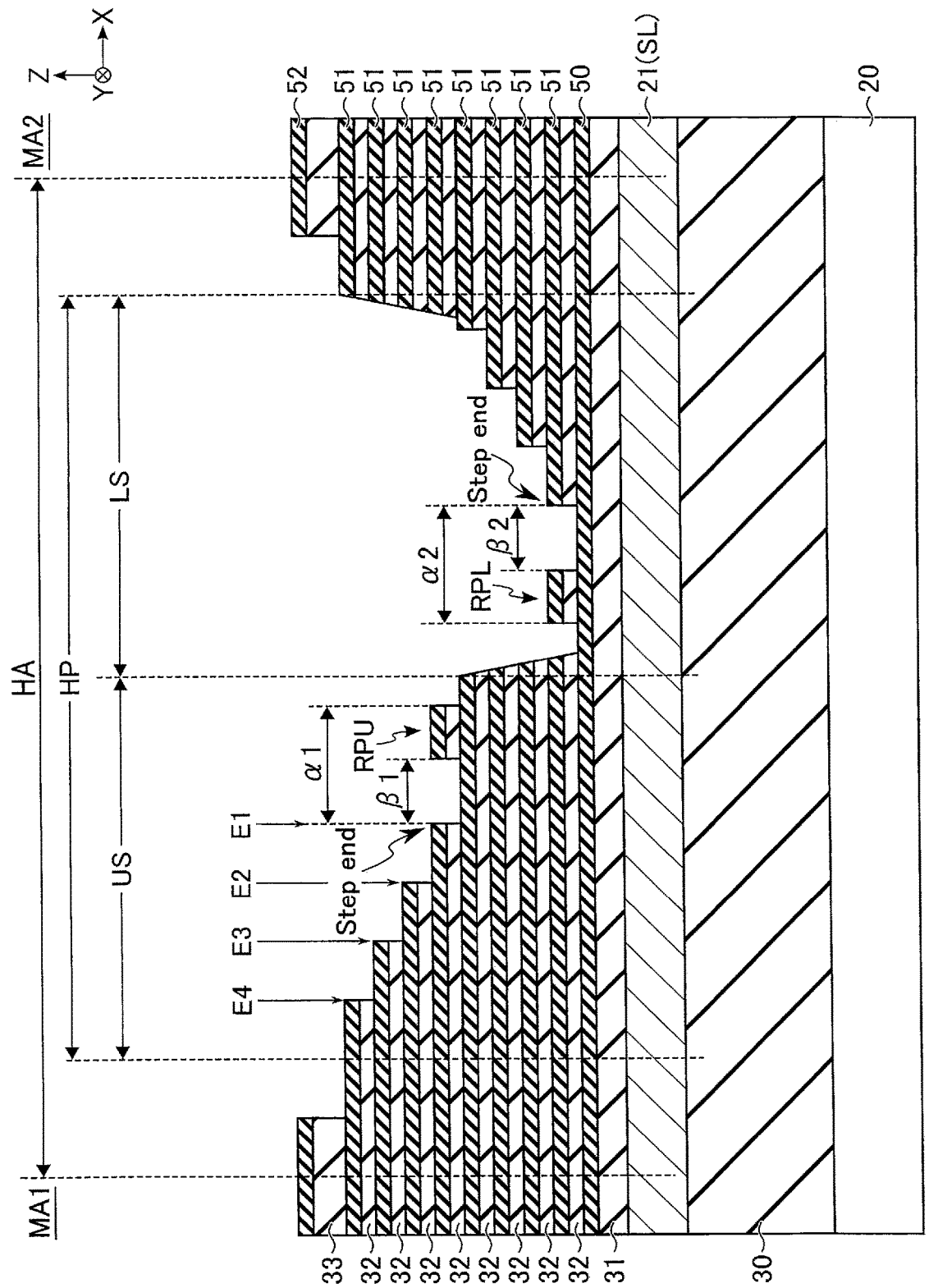
FIG. 20 is a cross-sectional view showing an example of a cross-sectional structure in the course of manufacturing of the semiconductor memory device according to the embodiment.

In the process of step S16, as shown in FIG. 20, a processing conversion difference accompanying the process of step S15 is measured. In the present specification, the "processing conversion difference" corresponds to a dimension indicating a change in stepped structure accompanying the multistage processing. For measurement of the processing conversion difference, for example, a critical dimension-scanning electron microscope (CD-SEM) is used. A dimension measured as a processing conversion difference is, for example, used for adjustment of processing parameters at the time of manufacture of a wafer to be treated after the current wafer. Although multistage processing is not performed in the contact area US, a measurement result in the contact area US can be used, for example, for management of the width of a terraced portion (adjustment of processing parameters in step S13).

For example, in the process of step S16, in the contact area US, a distance between the reference pattern RPU and an end portion (hereinafter, referred to as a "step end of the upper-side step part") of a terraced portion adjacent to the reference pattern RPU in the X direction is measured. Specifically, in the contact area US, dimensions of "α1" and "β1" shown in FIG. 20 are measured. "α1" is a length, along the X direction, between the step end of the upper-side step part and a portion of the reference pattern RPU furthest from the step end in the X direction. β1 is a length, along the X direction, between the step end of the upper-side step part and a portion of the reference pattern RPU closest to the step end in the X direction. Then, formula "(α1+β1)/2" is calculated so that a distance between the center of gravity of the reference pattern RPU and the step end of the upper-side step part is calculated.

In addition, "E1", "E2", "E3", and "E4" shown in FIG. 20 indicate end portions of the terraced portions of the first, second, third, and fourth stages within the contact area US, respectively. The end portion E1 corresponds to the above-described step end of the upper-side step part. In step S16, not only the distance between the center of gravity of the reference pattern. RPU and the end portion E1, but also a distance between the center of gravity of the reference pattern RPU and each of the end portions E2, E3, and E4 can be calculated. Then, a distance between adjacent end portions in the X direction is calculated based on a plurality of calculated distances so that a width of a terraced portion provided between the adjacent end portions in the X direction is calculated. By this calculation result, processing parameters of steps associated with step S13 can be adjusted at the time of manufacture of a wafer to be treated after the current wafer. The number of end portions whose distance from the center of gravity of the reference pattern RPU is measured may be omitted as appropriate. For the adjustment of processing parameters in step S13, an average value of widths of a plurality of terraced portions provided in the upper-side step part may be used.

Similarly, in the process of step S16, in the contact area LS, a distance between the reference pattern RPL and an end portion (hereinafter, referred to as a "step end of the lower-side step part") of a terraced portion adjacent to the reference pattern RPL in the X direction is measured. Specifically, in the contact area LS, dimensions of "α2" and "β2" shown in FIG. 20 are measured. "α2" is a length, along the X direction, between the step end of the lower-side step part and a portion of the reference pattern RPL furthest from the step end in the X direction. "β2" is a length, along the X direction, between the step end of the lower-side step part and a portion of the reference pattern RPL closest to the step end in the X direction. Then, formula "(α2+β2)/2" is calculated so that a distance between the center of gravity of the reference pattern RPL and the step end of the lower-side step part is calculated. This calculation result corresponds to a "processing conversion difference". By this calculation result, the processing parameters of steps associated with step S15 can be adjusted at the time of the manufacture of a wafer to be treated after the current wafer. The widths of the terraced portions in the contact area LS may be measured in the same manner as in the contact area US.

In the process of step S17, a memory pillar MP is formed. Simply speaking, first, the insulating layer 35 is formed, and the level differences formed in the hookup area HA are filled. Then, the top surface of the structure is planarized by, for example, CMP (Chemical Mechanical Polishing). Next, a mask in which areas corresponding to a plurality of memory pillars MP are opened is formed. Then, a plurality of memory holes are formed by anisotropic etching using the mask. After that, the block insulating film 45, the insulating film 44, and the tunnel insulating film 43 are sequentially formed on side surfaces and bottom surfaces of the memory holes. Then, a part of the block insulating film 45, the insulating film 44, and the tunnel insulating film 43 provided at a bottom portion of each memory hole is removed, and the semiconductor layer 41 and the core member 40 are formed in the memory hole. Thereafter, a part of the core member 40 provided at an upper part of the memory hole is removed, and the semiconductor layer 41 is formed in that part. Thereby, a plurality of a memory pillars MP are formed.

Figure 21:
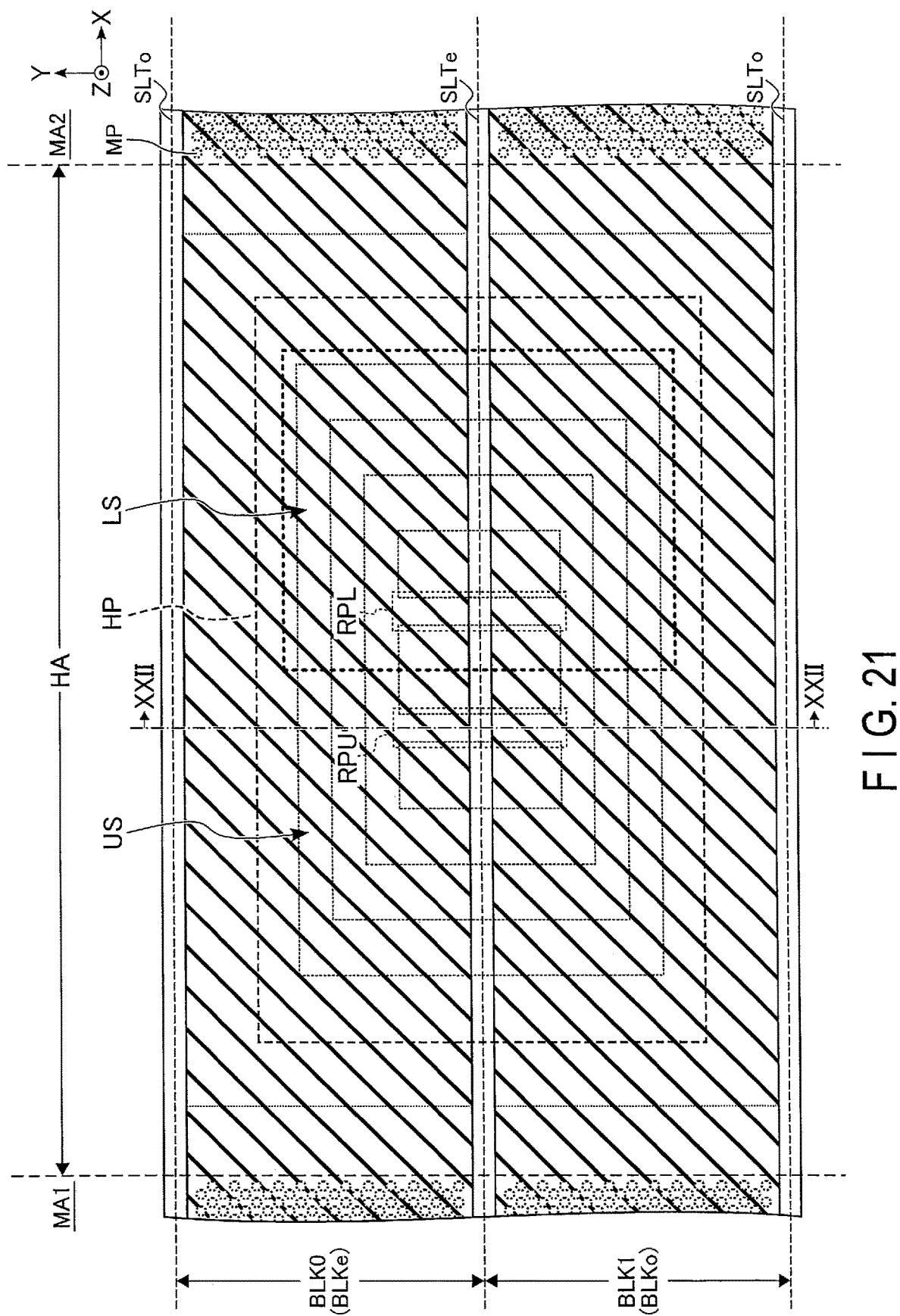
FIG. 21 is a plan view showing an example of a planar layout in the course of manufacturing of the semiconductor memory device according to the embodiment.
Figure 22:
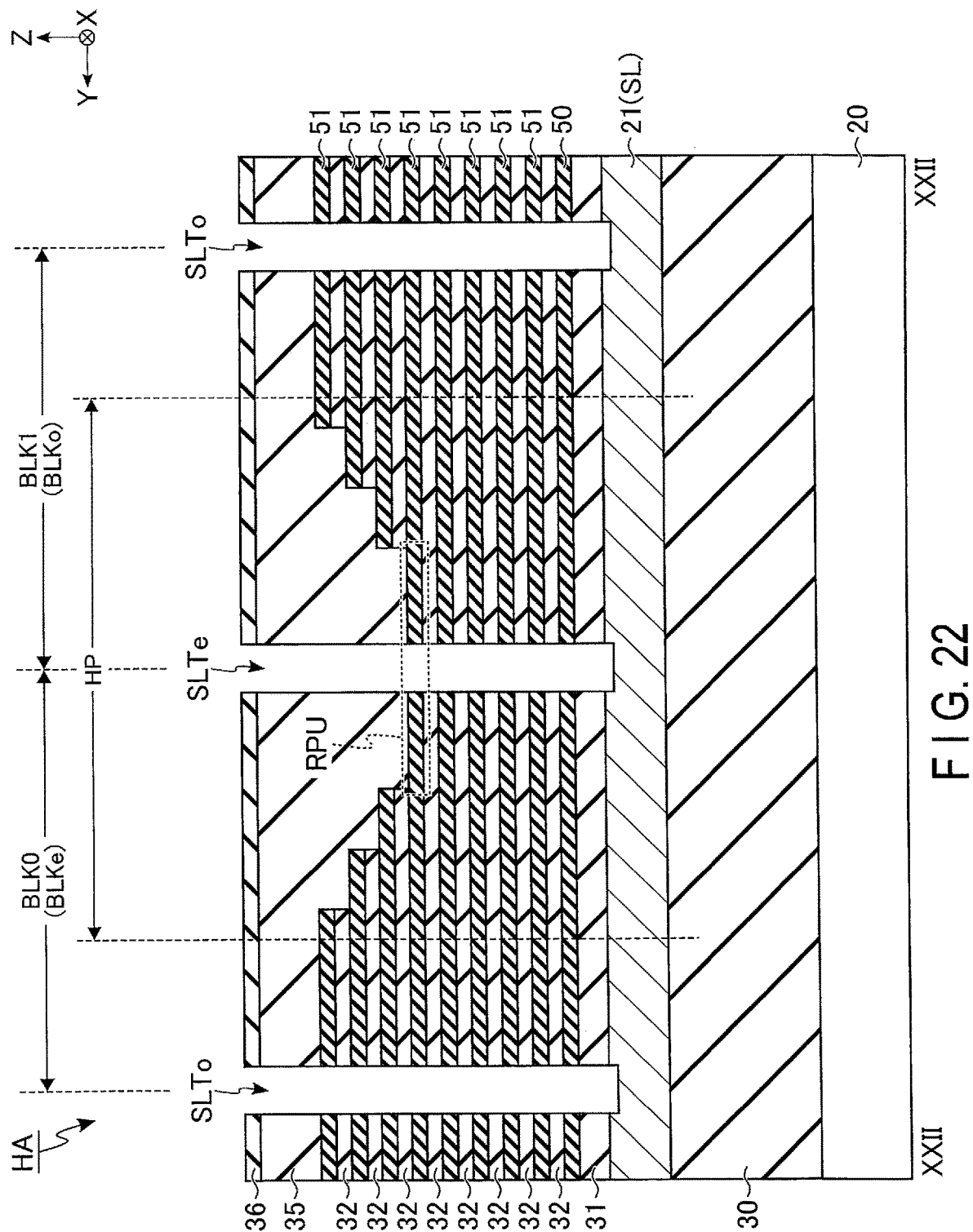
FIG. 22 is a cross-sectional view, taken along line XXII-XXII in FIG. 21, showing an example of a cross-sectional structure in the course of manufacturing of the semiconductor memory device according to the embodiment.

In the process of step S18, as shown in FIGS. 21 and 22, a plurality of slits SLT are formed. Specifically, first, the insulating layer 36 is formed on the insulating layer 35. The insulating layer 36 protects the upper portions of the memory pillars MP. The insulating layers 35 and 36 are included in the insulating layer 34 shown in FIG. 8. Then, a mask in which areas corresponding to the slits SLT are opened is formed by photolithography, etc. After that, by anisotropic etching using the mask, for example, the slits SLT that divide each of the insulating layers 31, 32, 35 and 36, and the sacrificial members 50 and 51 are formed. In an unillustrated area, the slits SLT also divide each of the insulating layer 33 and the sacrificial member 52.

In the process of step S19, a replacement process of the stacked interconnects is performed, and a stacked interconnect structure is formed as shown in FIG. 23. Specifically, first, the sacrificial members 50 to 52 are selectively removed via the slits SLT by wet etching using thermal phosphoric acid, etc. The structure from which the sacrificial members 50 to 52 have been removed is maintained by a plurality of memory pillars MP, support pillars, illustration of which is omitted, etc. Thereafter, a conductor is filled in the spaces from which the sacrificial members 50 to 52 have been removed, via the slits SLT. For the formation of the conductor in this step, chemical vapor deposition (CVD), for example, is used.

After that, the conductor formed inside the slits SLT is removed by an etch-back process, and the conductor formed in adjacent interconnect layers is separated. Thereby, the conductive layer 22 which functions as a select gate line SGS, conductive layers 23 which respectively function as word lines WL0 to WL7, and conductive layer 24 which functions as a select gate line SGD, are respectively formed. The conductive layers 22 to 24 formed in this step may include a barrier metal. In this case, in the formation of the conductor after the removal of the sacrificial members 50 to 52, tungsten is formed after, for example, a titanium nitride film is formed as a barrier metal.

Figure 24:
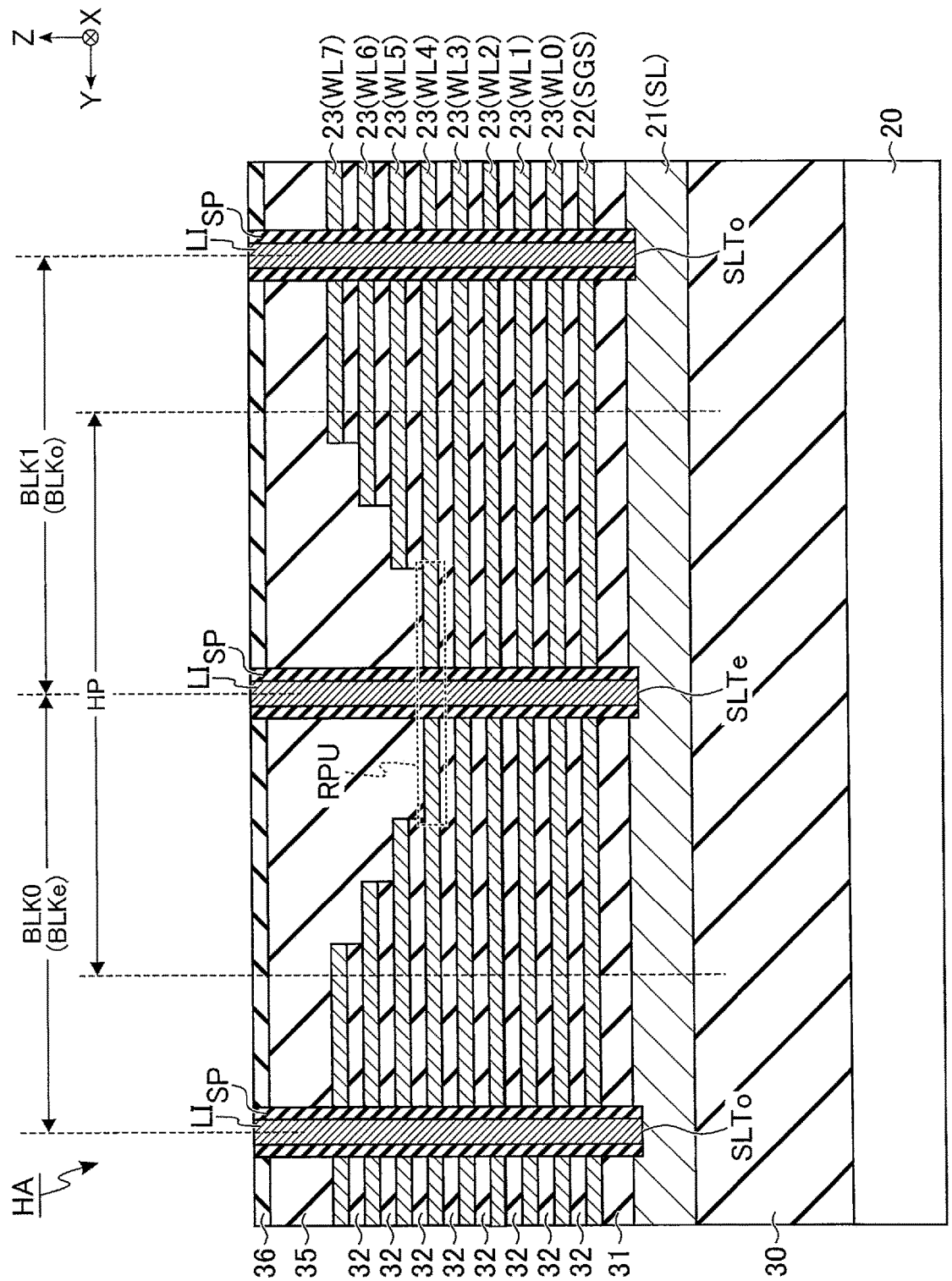
FIG. 24 is a cross-sectional view showing an example of a cross-sectional structure in the course of manufacturing of the semiconductor memory device according to the embodiment.

In the process of step S20, a filling process of the slits SLT is performed as shown in FIG. 24. Specifically, an insulating film (spacer SP) is formed so as to cover a side surface and a bottom surface of each slit SLT. Then, a part of the spacer SP provided at a bottom portion of the slit SLT is removed, and a part of the conductive layer 21 is exposed at the bottom portion of the slit SLT. Thereafter, a conductor (contact LI) is formed in the slit SLT, and the conductor formed outside the slit SLT is removed by, for example, CMP. After this, a plurality of concave portions are formed between slits SLT adjacent to each other in the Y direction so as to be in parallel to the slits SLT, and an insulating film is embedded in each concave portion to form a slit SHE that divides the conductive layer 24 in the Y direction.

By the manufacturing process of the semiconductor memory device 1 according to the embodiment described above, the stacked interconnect structure in the memory cell array 10 is formed. The above-described manufacturing process is merely an example, and the manufacturing process is not limited thereto. For example, other processes may be inserted between the manufacturing steps, and some of the steps may be omitted or integrated. The manufacturing steps may be interchanged where possible. For example, the step of forming memory pillars MP and the step of forming a stepped structure of stacked interconnects may be interchanged.

[3] Advantageous Effects of Embodiment

According to the semiconductor memory device 1 according to the embodiment described above, it is possible to improve the yield of the semiconductor memory device and reduce the chip area of the semiconductor memory device 1. In the following, details of advantageous effects in the semiconductor memory device 1 according to the embodiment will be described using a comparative example.

A semiconductor memory device including three-dimensionally stacked memory cells includes, for example, stacked interconnects including a word line WL, and a memory pillar MP which penetrates the stacked interconnects and whose intersection with the word line WL functions as the memory cell. The stacked interconnects have, for example, a portion (hereinafter, referred to as a "step part") provided in a stepped shape. The row decoder module 15 applies a voltage to the word line WL, etc. through a contact coupled to the step part of the stacked interconnects. When a misalignment between the step part of the stacked interconnects and the contact occurs at the time of manufacturing of the semiconductor memory device, a failure, such as a short circuit of the word line WL, may occur. Thus, at the time of manufacturing of the semiconductor memory device, it is preferable that a finishing state of the step part of the stacked interconnects, e.g. a position of the step part, be managed.

Herein, as a comparative example of the embodiment, a case where a step part of stacked interconnects is arranged at both ends of the memory cell array 10 will be described. FIG. 25 shows an example of a planar layout of a semiconductor memory device according to a comparative example of the embodiment. As shown in FIG. 25, the semiconductor memory device according to the comparative example of the embodiment includes at least one reference pattern RP in an area outside a memory cell array 10. The reference pattern RP is used for management of a finishing state of a step part of stacked interconnects and arranged as an isolated island pattern in the vicinity of the memory cell array 10.

FIG. 26 shows a cross section, taken along line XXVI-XXVI in FIG. 25, showing an area including the step part of the stacked interconnects and the reference pattern RP. In addition, FIG. 26 corresponds to a state before a replacement process of the stacked interconnects is performed, after insulating layers INS and sacrificial members SM stacked alternately are processed into a staircase pattern. As shown in FIG. 26, for management of a finishing state of the step part of the stacked interconnects, for example, a distance between a step end and the reference pattern RP is measured in the same manner as in the embodiment.

However, the reference pattern RP arranged in an area outside the memory cell array 10 can cause dust in the subsequent manufacturing steps. For example, use of hydrogen fluoride in a cleaning step of the wafer's rear surface may lead to hydrogen fluoride engulfing around the wafer's front surface. The engulfing hydrogen fluoride can dissolve the insulating layer INS of the reference pattern RP arranged in the vicinity of an outer periphery of the wafer. Then, the sacrificial member SM of the isolated reference pattern RP can be scattered away from the substrate surface as dust. The generated dust can be a cause of decreased yield from the semiconductor memory device. Thus, in the semiconductor memory device, it is preferable that the reference pattern RP have a structure that can suppress dust generation.

In contrast, the semiconductor memory device 1 according to the embodiment has a stadium-shaped stepped structure (hookup part HP). The hookup part HP includes the contact areas US and LS and the references patterns RPU and RPL. The contact areas US and LS have stepped structures with different heights. The reference pattern RPU is used for measurement of the position of the upper-side step part included in the contact area US, and is continuous with any one of the stacked interconnects within the contact area US. The reference pattern RPL is used for measurement of the position of the lower-side step part included in the contact area LS, and is continuous with any one of the stacked interconnects within the contact area LS.

In this way, in the semiconductor memory device 1 according to the embodiment, the reference patterns RPU and RPL are not isolated island patterns like the comparative example of the embodiment. Thus, the reference patterns RPU and RPL in the embodiment cannot be a cause of dust as in the comparative example. Accordingly, the semiconductor memory device 1 according to the embodiment can realize both adjustment of processing parameters by measurement of a step position and suppression of dust generation due to the isolated island pattern. As a result, the semiconductor memory device 1 according to the embodiment can improve the yield and reduce the chip area thereof.

In addition, in the semiconductor memory device 1 according to the embodiment, the lower-side step part within the contact area LS is formed by multistage processing. Then, a boundary portion of the multistage processing is arranged between the reference patterns RPU and RPL. That is, the reference pattern RPU is arranged at the same height as that of the step end of the upper-side step part within the contact area US, and the reference pattern RPL is arranged at the same height as that of the step end of the lower-side step part within the contact area LS.

Thereby, in the semiconductor memory device 1 according to the embodiment, measurement accuracy of the position of the upper-side step part and the position of the lower side step part is improved. Then, the measurement accuracy of the position of the lower-side step part is improved so that a processing conversion difference due to the multistage processing can be measured with high accuracy. Consequently, the semiconductor memory device 1 according to the embodiment can set processing parameters in consideration of a processing conversion difference due to multistage processing, thereby improving the yield thereof. In addition, in the semiconductor memory device 1 according to the embodiment, the mask REG1 for forming the reference patterns RPU and RPL is set so that a portion covering the reference pattern RPU and RPL is removed by single slimming.

Thereby, in the semiconductor memory device 1 according to the embodiment, each of the reference patterns RPU and RPL is formed by only one set of the insulating layer 32 and the conductive layer 23, leading to the formation of a structure in which the width of each of the reference patterns RPU and RPL in the X direction is suppressed. As a result, the semiconductor memory device 1 according to the embodiment can suppress an increase in area of the hookup part HP due to arrangements of the reference patterns RPU and RPL.

[4] Modifications of Embodiment

The semiconductor memory device 1 according to the embodiment can be modified in various ways. In the following, points which differ from the embodiment will be described regarding first, second, third, and fourth modifications of the embodiment.

(First Modification)

A semiconductor memory device 1 according to the first modification of the embodiment differs in the number of stacked word lines WL and a stepped structure within a hookup area HA from the embodiment.

Figure 27:
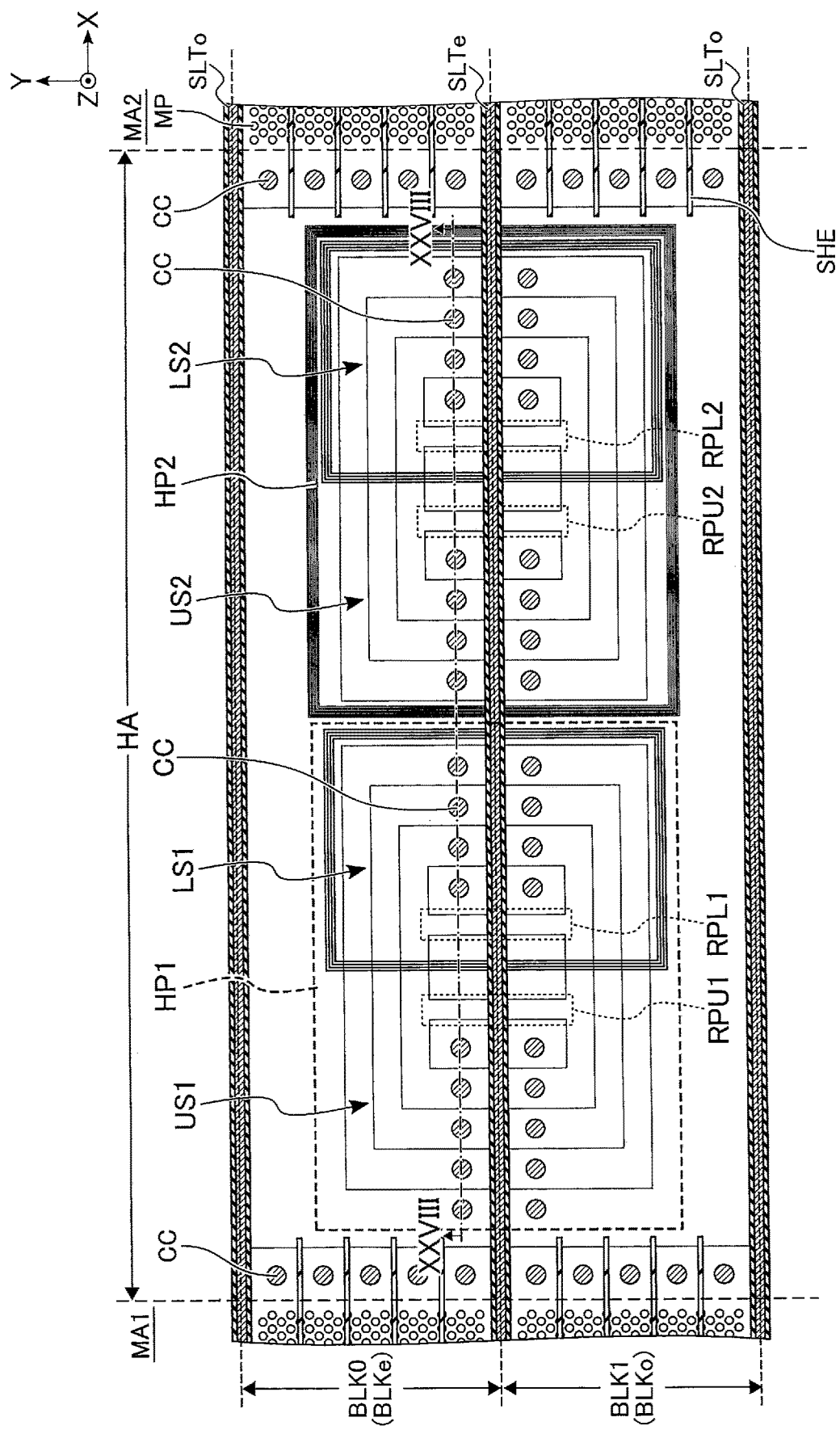
FIG. 27 is a plan view showing an example of a planar layout in a hookup area of a memory cell array included in a semiconductor memory device according to a first modification of the embodiment.

FIG. 27 is an example of a planar layout of a memory cell array 10, in the hookup area HA, included in the semiconductor memory device 1 according to the first modification of the embodiment, showing an area similar to that shown in FIG. 7 referred to in the embodiment. As shown in FIG. 27, in the first modification of the embodiment, the number of stacked word lines WL is greater than that in the embodiment. In addition, in the memory cell array 10 in the first modification of the embodiment, the hookup part HP in the embodiment is divided into two hookup parts HP1 and HP2 aligned in the X direction.

The height of a stadium-shaped stepped structure provided in the hookup part HP1 is greater than that of a stadium-shaped stepped structure provided in the hookup part HP2. The hookup part HP1 includes contact areas US1 and LS1. The hookup part HP2 includes contact areas US2 and LS2. The contact areas US1, LS1, US2, and LS2 include stepped structures of differing heights from one another. In addition, the contact areas US1, LS1, US2, and LS2 include reference patterns RPU1, RPL1, RPU2, and RPL2, respectively.

The reference pattern RPU1 is used for measurement of the position of the stepped structure provided in the contact area US1, and includes a portion continuous with any one of stacked interconnects forming the stepped structure. The reference pattern RPL1 is used for measurement of the position of the stepped structure provided in the contact area LS1, and includes a portion continuous with any one of stacked interconnects forming the stepped structure. The reference pattern RPU2 is used for measurement of the position of the stepped structure provided in the contact area US2, and includes a portion continuous with any one of stacked interconnects forming the stepped structure. The reference pattern RPL2 is used for measurement of the position of the stepped structure provided in the contact area LS2, and includes a portion continuous with any one of stacked interconnects forming the stepped structure.

Figure 28:
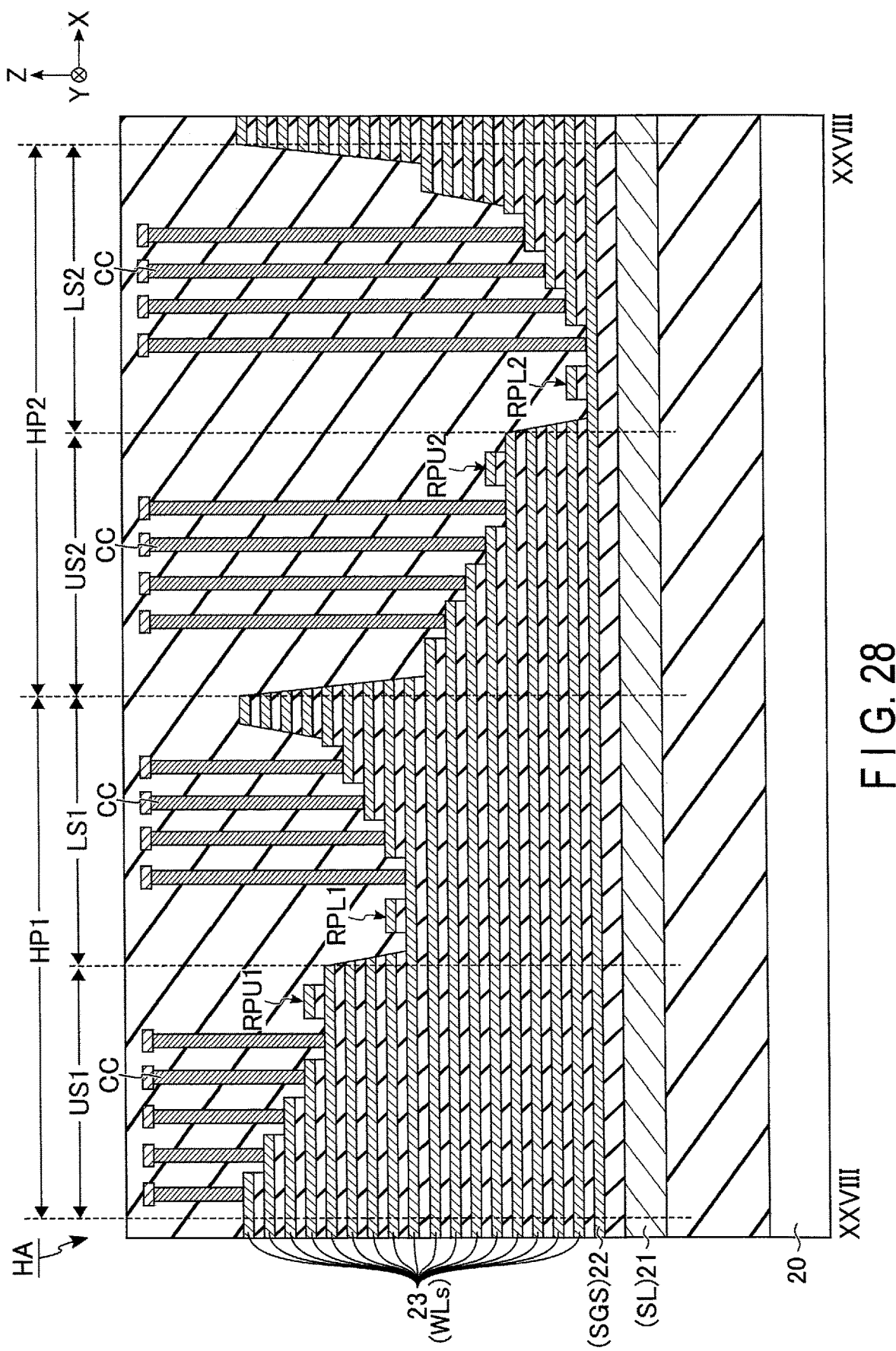
FIG. 28 is a cross-sectional view, taken along line XXVIII-XXVIII in FIG. 27, showing an example of a cross-sectional structure in the hookup area of the memory cell array included in the semiconductor memory device according to the first modification of the embodiment.

FIG. 28 is a cross-sectional view, taken along line XXVIII-XXVIII in FIG. 27, showing an example of a cross-sectional structure of the memory cell array 10, in the hookup area HA, included in the semiconductor memory device 1 according to the first modification of the embodiment. As shown in FIG. 28, in the hookup part HP1, the contact areas US1 and LS1 have a structure symmetrical in the X direction, except their heights are different. In the hookup part HP2, the contact areas US2 and LS2 have a structure symmetrical in the X direction, except their heights are different.

For example, the stepped structure of the hookup part HP1 and the stepped structure of the hookup part HP2 are different only in terms of height. That is, the contact area LS1 is provided by multistage processing after a similar structure to the stepped structure of the contact area US1 is formed. The contact area LS2 is provided by multistage processing after a similar structure to the stepped structure of the contact area US2 is formed. The difference in height of the hookup parts HP1 and HP2 is provided by multistage processing after a similar structure to the stepped structure of the hookup part HP1 is formed. The contact area US1 is arranged in a layer above the contact area LS1. The contact area US2 is arranged in a layer above the contact area LS2. The contact area LS1 is arranged in a layer above the contact area US2. The other configurations of the semiconductor memory device 1 according to the first modification of the embodiment are the same as those of the embodiment.

As described above, the memory cell array 10 may include a plurality of hookup parts HP each including the reference patterns RP. The step position of each of the contact areas US1, LS1, US2, and LS2 can be managed by measuring the reference patterns RPU1, RPL1, RPU2, and RPL2 and the associated step ends using a length measuring device such as a CD-SEM. As a result, the semiconductor memory device 1 according to the first modification of the embodiment can set processing parameters in consideration of a processing conversion difference due to multistage processing, thereby improving the yield thereof.

In the first modification of the embodiment, the case where the hookup part HP is divided into two is exemplified, but the hookup part HP may be divided into three or more. In this case, the divided hookup parts HP have stadium-shaped stepped structures with different heights from one another. In such a case, the reference pattern RP may be provided in each of the contact areas US and LS of each hookup part HP. Thereby, the position of each of the stepped structures with different heights can be managed using a length measuring device such as a CD-SEM.

(Second Modification)

A semiconductor memory device 1 according to the second modification of the embodiment differs from the first modification of the embodiment in terms of the number of reference patterns RP provided.

Figure 29:
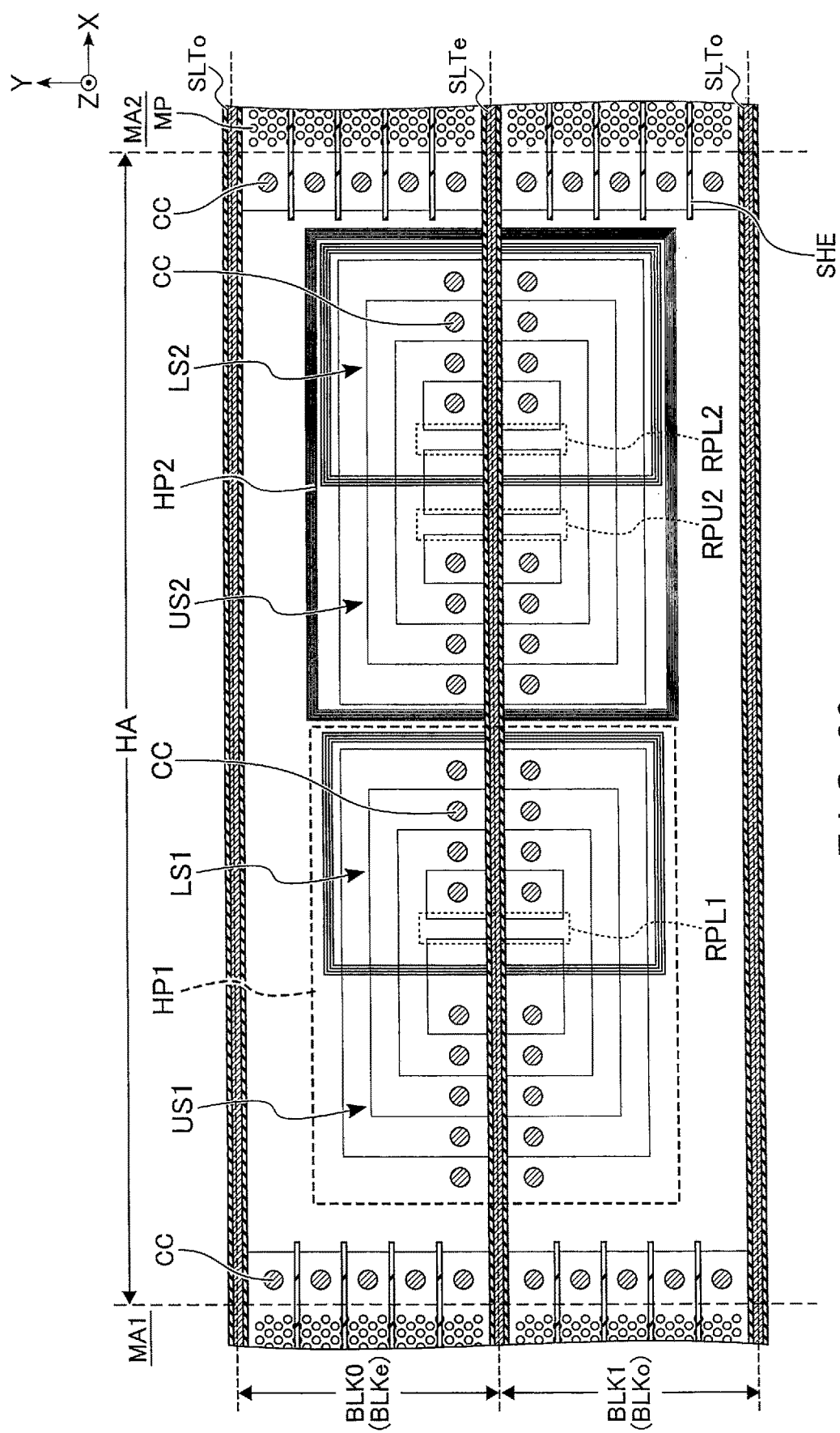
FIG. 29 is a plan view showing an example of a planar layout in a hookup area of a memory cell array included in a semiconductor memory device according to a second modification of the embodiment.

FIG. 29 is an example of a planar layout of a memory cell array 10, in a hookup area HA, included in the semiconductor memory device 1 according to the second modification of the embodiment, showing an area similar to that shown in FIG. 7 referred to in the embodiment. As shown in FIG. 29, the memory cell array 10 in the second modification of the embodiment has a structure in which the reference pattern RPU1 is omitted from the memory cell array 10 in the first modification of the embodiment. The other configurations of the semiconductor memory device 1 according to the second modification of the embodiment are the same as those of the first modification of the embodiment.

By omitting the reference pattern RPU1, the semiconductor memory device 1 according to the second modification of the embodiment can reduce the area of the hookup area HA as compared with the first modification of the embodiment. The reference pattern RPU1 corresponds to the contact area US1 where multistage processing is not performed. A step position in a contact area where multistage processing is not performed is less likely to shift than a step position in a contact area where multistage processing is performed.

As described above, some of the reference patterns RP may be omitted as appropriate depending on the degree of quality control. Further, a reference pattern RP may be omitted in a contact area corresponding to a middle layer, and a step position in the contact area corresponding to the middle layer may be estimated based on: a measurement result of a step position in a reference pattern RP in a contact area corresponding to an upper layer; and a measurement result of a step position in a reference pattern RP in a contact area corresponding to a lower layer.

(Third Modification)

A semiconductor memory device 1 according to the third modification of the embodiment differs in terms of a stepped structure and arrangement of a reference pattern within a hookup part HP from the embodiment.

Figure 30:
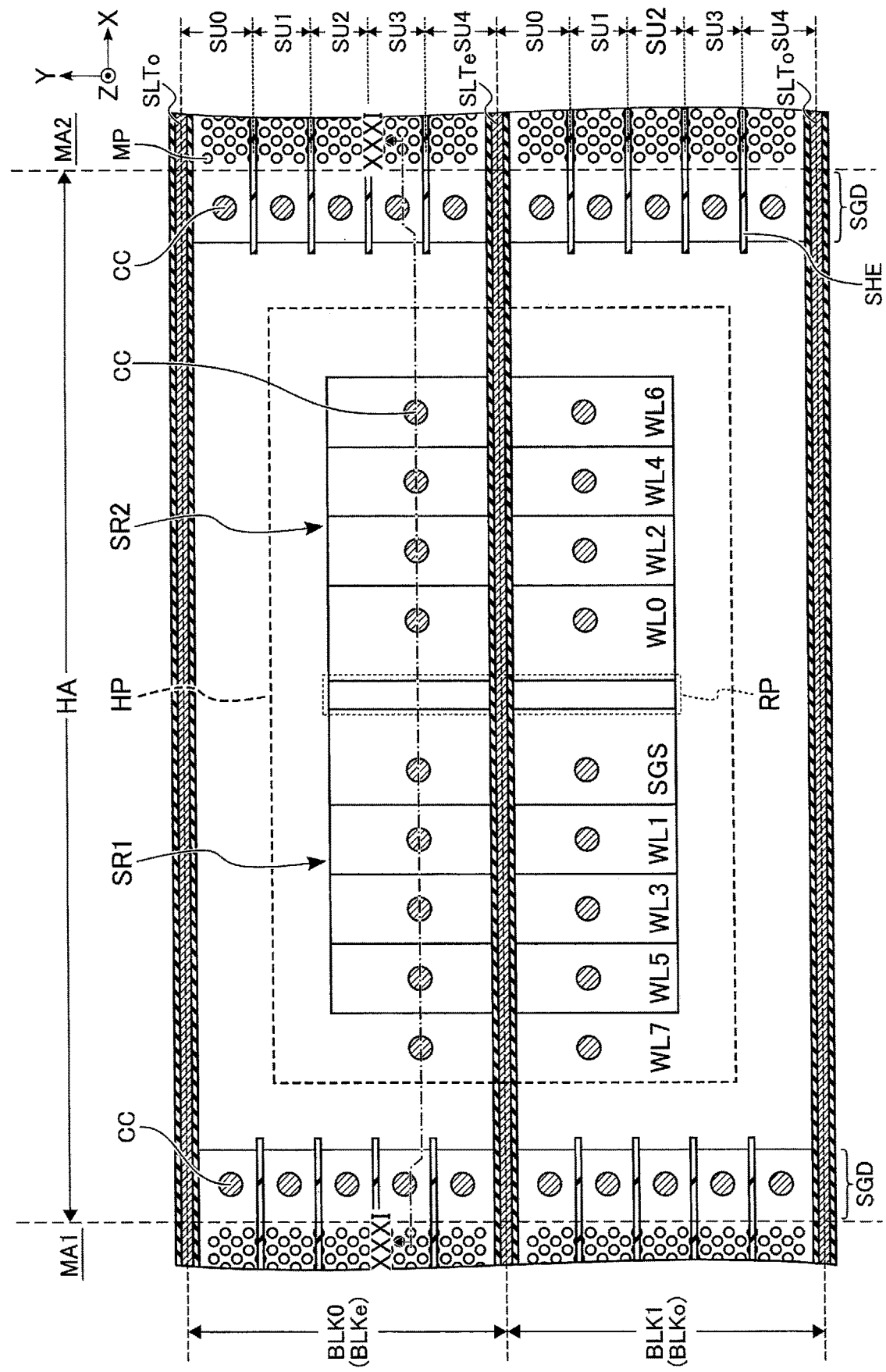
FIG. 30 is a plan view showing an example of a planar layout in a hookup area of a memory cell array included in a semiconductor memory device according to a third modification of the embodiment.

FIG. 30 is an example of a planar layout of a memory cell array 10, in a hookup area HA, included in a semiconductor memory device 1 according to the third modification of the embodiment, showing an area similar to that shown in FIG. 7 referred to in the embodiment. As shown in FIG. 30, the semiconductor memory device 1 according to the third modification of the embodiment is structured in a way that stepped structures facing each other in the X direction are included and a dummy stepped structure is omitted in a hookup part HP. An area in which one of the stepped structures facing each other in the X direction is formed is referred to as a "contact area SR1", and an area in which the other one of the stepped structures facing each other in the X direction is formed is referred to as a "contact area SR2".

Specifically, a plurality of terraced portions in the hookup part HP are arranged in the order of word lines WL7, WL5, WL3, WL1, select gate line SGS, word lines WL0, WL2, WL4, and WL6. In other words, the contact area SR1 includes the terraced portions of the word lines WL7, WL5, and WL3 and the select gate line SGS, and the contact area SR2 includes the terraced portions of the word lines WL0, WL2, WL4, and WL6. Then, a reference pattern RP is provided between the terraced portion of the select gate line SGS and the terraced portion of the word line WL0. The contact area SR2 includes a reference pattern RPL, and the reference pattern RP includes a portion continuous with any one of stacked interconnects in the same manner as in the embodiment.

Figure 31:
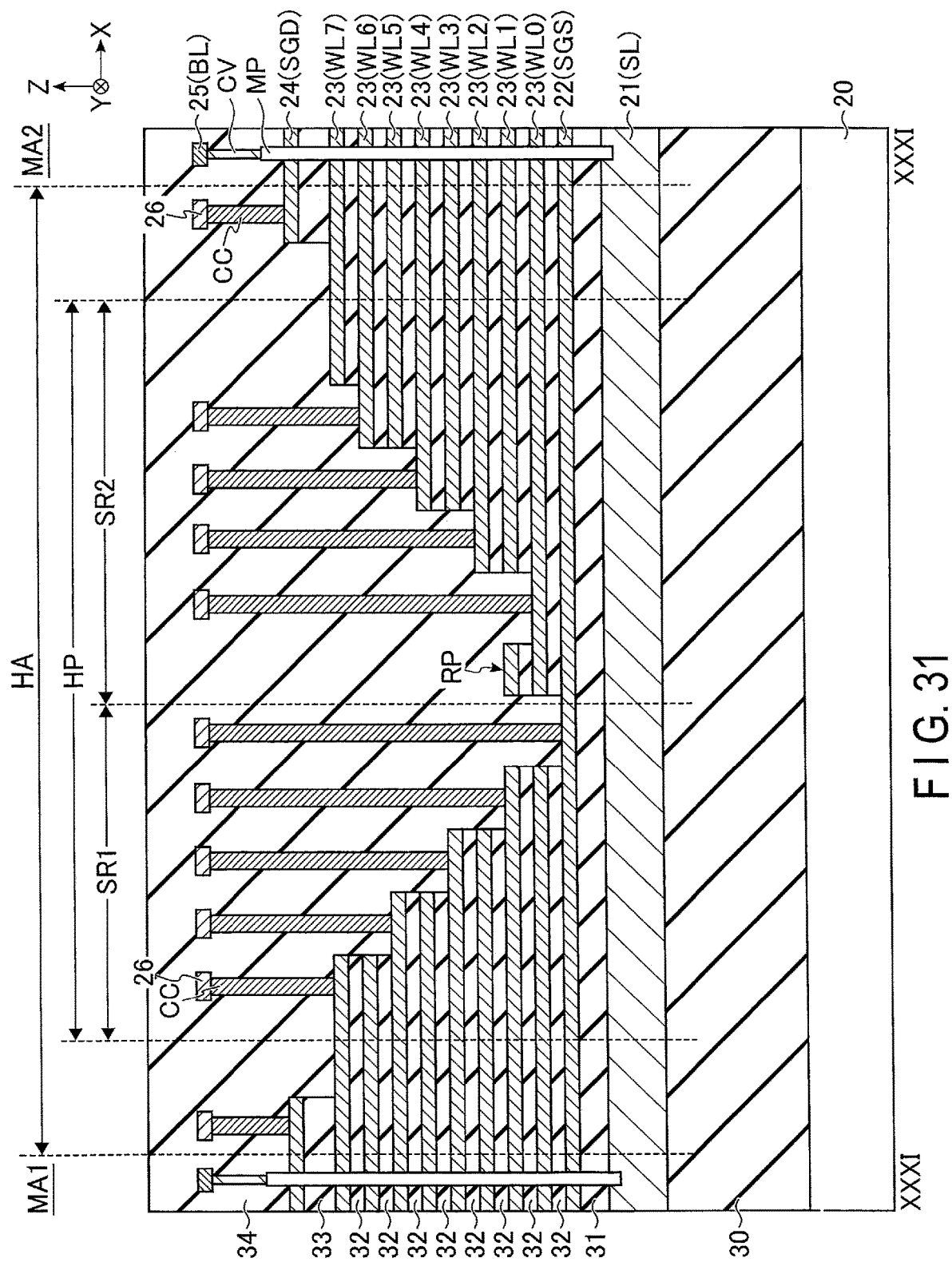
FIG. 31 is a cross-sectional view, taken along line XXXI-XXXI in FIG. 30, showing an example of a cross-sectional structure in the hookup area of the memory cell array included in the semiconductor memory device according to the third modification of the embodiment.

FIG. 31 is a cross-sectional view, taken along line XXXI-XXXI in FIG. 30, showing an example of a cross-sectional structure of the memory cell array 10, in the hookup area HA, included in the semiconductor memory device 1 according to the third modification of the embodiment. As shown in FIG. 31, in the hookup part HP, a stepped structure provided in the contact area SR1 has level differences for two sets of the insulating layer 32 and the conductive layer 23. Similarly, a stepped structure provided in the contact area SR2 has level differences for two sets of the insulating layer 32 and the conductive layer 23. The reference pattern RP is, for example, provided at the same height as that of the word line WL1. The reference pattern RP is not limited to the height for one set of the insulating layer 32 and the conductive layer 23, and may have a height for two sets or more. The other configurations of the semiconductor memory device 1 according to the third modification of the embodiment are the same as those of the embodiment.

The stepped structure as in the third modification of the embodiment is formed by performing multiple instances of etching using a plurality of masks. In this case, a stepped structure capable of coupling the contacts CC can be formed without forming a dummy stepped structure. Also in such a case, the reference pattern RP can be used for measurement of the width of the terraced portion. For example, a distance between the center of gravity of the reference pattern RP and an end portion of each terraced portion within the contact area SR1 is calculated. Similarly, a distance between the center of gravity of the reference pattern RP and an end portion of each terraced portion within the contact area SR2 is calculated. Then, a distance between adjacent end portions in the X direction is calculated based on the plurality of calculated distances so that a width of a terraced portion provided between the adjacent end portions in the X direction is also calculated.

By this calculation result, processing parameters of steps associated with formation of a stepped structure can be adjusted at the time of manufacture of a wafer to be treated after the current wafer. The number of end portions whose distance from the center of gravity of the reference pattern RP is measured may be omitted as appropriate. For adjustment of processing parameters of steps associated with formation of a stepped structure, an average value of the calculated widths of the plurality of terraced portions may be used. As a result, the semiconductor memory device 1 according to the third modification of the embodiment can manage the step position using the reference pattern RP, thereby improving the yield thereof.

The case where the stacked interconnects are provided in a staircase pattern having level differences only in the X direction in the hookup part HP is exemplified in the third modification of the embodiment, but the structure is not limited thereto. In the hookup part HP, two or more rows of steps may further be formed in the Y direction. The number of level differences formed at the stacked word lines WL in the X and Y directions can be freely designed.

(Fourth Modification)

A semiconductor memory device 1 according to the fourth modification of the embodiment differs in arrangements of a memory area MA and a hookup area HA from the embodiment.

Figure 32:
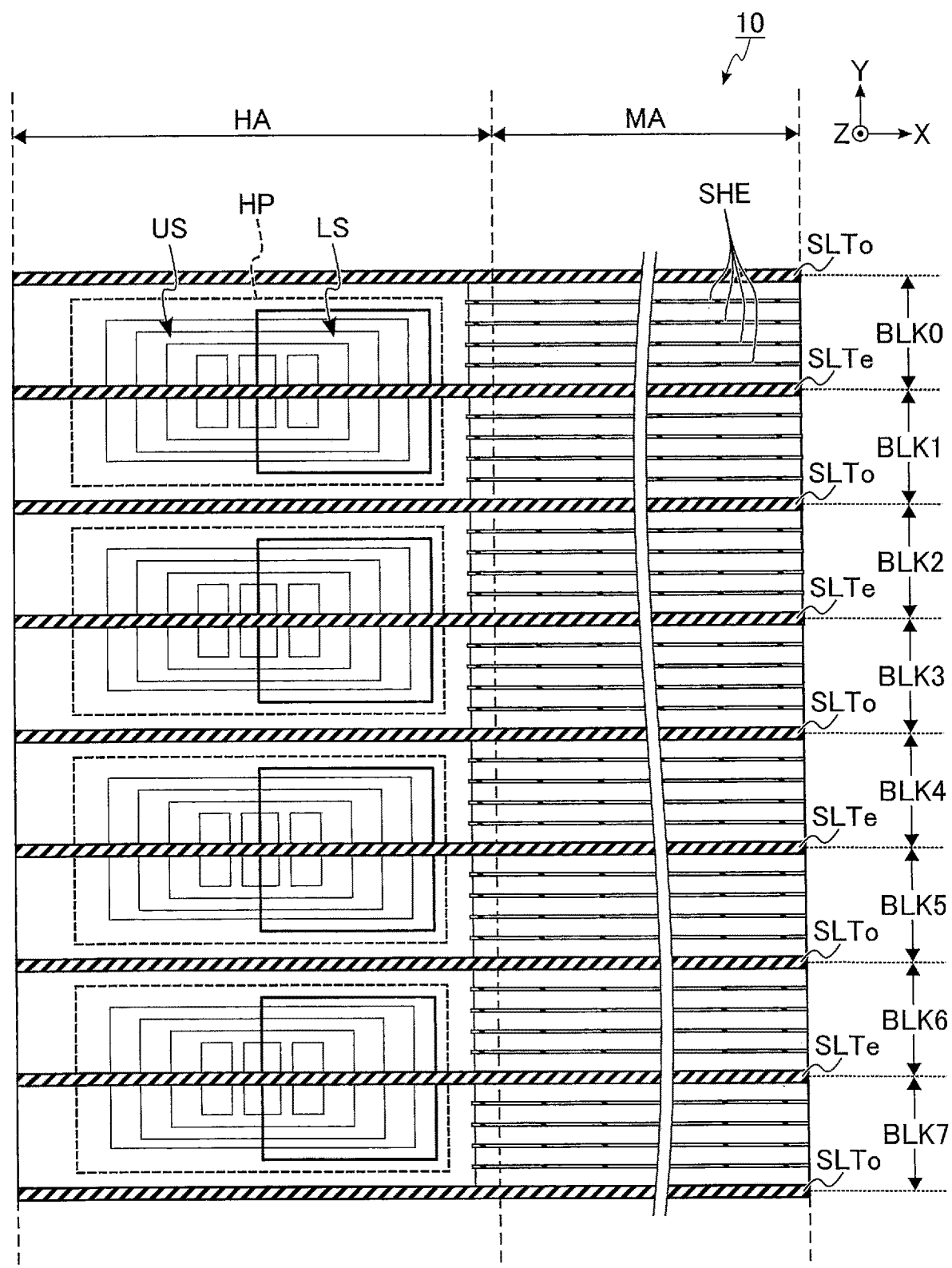
FIG. 32 is a plan view showing an example of a planar layout of a memory cell array included in a semiconductor memory device according to a fourth modification of the embodiment.

FIG. 32 is an example of a planar layout of a memory cell array 10 included in the semiconductor memory device 1 according to the fourth modification of the embodiment, showing an area similar to that shown in FIG. 3 referred to in the embodiment. As shown in FIG. 32, the semiconductor memory device 1 according to the fourth modification of the embodiment includes one memory area MA and one hookup area HA. The memory area MA is adjacent to the hookup area HA. The other configurations of the semiconductor memory device 1 according to the fourth modification of the embodiment are the same as those of the embodiment. In such a case as well, a reference pattern RP is arranged in a hookup part HP as appropriate so that a step position can be measured. As a result, the semiconductor memory device 1 according to the fourth modification of the embodiment can manage the step position using the reference pattern RP, thereby improving the yield thereof.

The case where the memory cell array 10 includes one hookup area HA is exemplified in the embodiment, but the structure is not limited thereto. In the memory cell array 10, at least one hookup area HA may be provided, and a plurality of hookup areas HA may be provided. The hookup area HA may be either arranged between two adjacent memory areas MA, or so as to sandwich a memory area MA from both sides. In a case where only one hookup area HA is provided, the hookup area HA is preferably inserted at a middle portion of the memory areas MA as shown in the embodiment. Thereby, the semiconductor memory device 1 can suppress any delay in voltage change at an end portion of a word line WL occurring due to interconnect resistance of the word line WL.

[5] Others

In the embodiment, the case where an end portion of an associated stepped structure is used for measurement of a processing conversion difference is exemplified, but the present invention is not limited thereto. It suffices that at least the center of gravity of a reference pattern RP is used, and in addition, terraced portions with different heights may be used, for measurement of a processing conversion difference. In the embodiment, the case where the hookup part HP is provided per two blocks BLK is exemplified, but the present invention is not limited thereto. The hookup part HP may be provided for each block BLK. In this case, the hookup part HP and each reference pattern RP are not divided by a slit SLT.

The structure of the memory cell array 10 in the semiconductor memory device 1 according to the embodiment may be an alternative structure. For example, the memory pillar MP may have a structure in which a plurality of pillars, i.e. two or more pillars, are coupled in the Z direction. The memory pillar MP may have a structure in which a pillar corresponding to a select gate line SGD and a pillar corresponding to a word line WL are coupled. Any memory pillar MP and bit line BL as well as any contact CC and conductive layer 26 may be coupled by a plurality of contacts coupled in the Z direction. In this case, a conductive layer may be inserted into a coupled portion of the contacts.

In the drawings used for explanation in the embodiment, the memory pillar MP is illustrated as having the same diameter in the Z direction, but is not limited thereto. For example, the memory pillar MP may have either a tapered or reverse-tapered shape, or a shape having a bloated middle portion (bowing shape). Similarly, each of the slits SLT and SHE may have a tapered or reverse-tapered shape, or even a bowing shape. Moreover, in the embodiment, each of the memory pillars MP and contacts CC has a circular cross section, but the cross section of each component may be ellipsoidal or in any shape.

In the embodiment, the inside of each of the slits SLT and SHE may be composed of a single or a plurality of types of insulators. In this case, for example, a contact corresponding to the source line SL (conductive layer 21) may be provided in the hookup area HA. In the present specification, a position of a slit SLT is, for example, specified based on a position of a contact LI. When the slit SLT is composed of an insulator, the position of the slit SLT may be specified by a seam in the slit SLT or a material that remains in the slit SLT at the time of the replacement process.

In the embodiment, the case where circuitry such as the sense amplifier module 16 is provided under the memory cell array 10 is described, but the present invention is not limited thereto. For example, the semiconductor memory device 1 may have a structure in which stacked interconnects such as word lines WL are formed on the semiconductor substrate 20, or a structure in which a chip having the sense amplifier module 16, etc. and a chip having the memory cell array 10 are bonded together. If the semiconductor memory device 1 has the chip-bonded structure, a structure corresponding to the semiconductor substrate 20 may be omitted.

The term "couple" throughout the specification refers to electrical coupling, and therefore may include coupling with some other elements interposed therebetween. The expression "electrically coupled" may refer to coupling of components with an insulator interposed therebetween as long as the operation can be conducted in the same manner as with an electrical coupling. The term "pillar" refers to a structure provided in a hole formed in the manufacturing process of the semiconductor memory device 1.

An "area" may be regarded as a configuration included in the semiconductor substrate 20 throughout the specification. For example, when the semiconductor substrate 20 is defined as including the memory areas MA1 and MA2 and hookup area HA, the memory areas MA1 and MA2 and hookup area HA are respectively associated with different areas above the semiconductor substrate 20. The "height" corresponds to, for example, a distance between a configuration to be measured and the semiconductor substrate 20 in the Z direction. As a criterion of the "height", a configuration other than the semiconductor substrate 20 may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-

What is claimed is:

1. A semiconductor memory device comprising:
a substrate including a first area, a second area, and a plurality of block areas, the first area and the second area being arranged in a first direction, each of the block areas being provided to extend in the first direction, and the block areas being arranged in a second direction intersecting the first direction;
a plurality of conductive layers divided for each of the block areas, the conductive layers being arranged in a third direction intersecting the first and second directions and provided to be separated from one another, the conductive layers including a plurality of terraced portions, and the terraced portions being provided not to overlap an upper conductive layer for each area in which the second area and any one of the block areas overlap;
a plurality of pillars provided for each of the block areas, each of the pillars being provided to penetrate the conductive layers, and a portion at which one of the pillars and one of the conductive layers intersect each other functioning as a memory cell; and
a plurality of contacts respectively provided on the terraced portions for each of the block areas, wherein
the first area contains at least one of the pillars,
the second area includes a first sub area and a second sub area arranged in the first direction,
the first sub area includes a first stepped structure, the first stepped structure including a structure in which a plurality of first terraced portions included in the terraced portions ascend or descend along the first direction and in a direction toward the first area,
the second sub area includes a second stepped structure and a first pattern, the second stepped structure including a structure in which a plurality of second terraced portions included in the terraced portions ascend or descend along the first direction and in a direction away from the first area, and the first pattern being continuous with any one of the conductive layers, and
the first pattern is arranged between the first stepped structure and the second stepped structure, at least one contact of the contacts being arranged between the first pattern and a terraced portion of a conductive layer physically continuous with the first pattern.

2. The device of claim 1, wherein
the first stepped structure is arranged in a layer above the second stepped structure, and
the first pattern is continuous with any one of a plurality of conductive layers forming the second stepped structure among the conductive layers.

3. The device of claim 2, wherein
the first sub area includes a second pattern, the second pattern being continuous with any one of a plurality of conductive layers forming the first stepped structure among the conductive layers, and
at least one contact of the contacts is arranged between the second pattern and a terraced portion of a conductive layer continuous with the second pattern.

4. The device of claim 3, wherein
a height of a level difference formed between the first pattern and the second pattern is greater than a height of the second stepped structure, the level difference being away from both the first pattern and the second pattern.

5. The device of claim 1, wherein
the first pattern is continuous with a conductive layer arranged adjacent to a lowermost conductive layer among a plurality of conductive layers forming the second stepped structure.

6. The device of claim 1, wherein
a width of the first pattern in the first direction is equal to or less than double a width of the terraced portion in the first direction.

7. The device of claim 1, wherein
the first sub area and the second sub area are divided in the second direction respectively by a boundary portion of two adjacent block areas.

8. The device of claim 7, wherein
a portion of the first sub area and the second sub area included in one of the two adjacent block areas and a portion of the first sub area and the second sub area included in another one of the two adjacent block areas have a structure symmetrical in the second direction.

9. The device of claim 1, wherein
the first stepped structure and the second stepped structure have a structure symmetrical in the first direction except for differences in heights thereof.

10. The device of claim 1, wherein
the second area further includes a third sub area and a fourth sub area arranged in the first direction,
the third sub area includes a third stepped structure, the third stepped structure including a structure in which a plurality of third terraced portions included in the terraced portions ascend or descend along the first direction and in a direction toward the first area,
the fourth sub area includes a fourth stepped structure and a third pattern, the fourth stepped structure including a structure in which a plurality of fourth terraced portions included in the terraced portions ascend or descend along the first direction and in a direction away from the first area,
the third stepped structure is arranged in a layer above the fourth stepped structure and below the second stepped structure,
the third pattern is continuous with any one of a plurality of conductive layers forming the fourth stepped structure among the conductive layers, and
the third pattern is arranged between the third stepped structure and the fourth stepped structure, at least one contact of the contacts being arranged between the third pattern and a terraced portion of a conductive layer continuous with the third pattern.

11. The device of claim 10, wherein
the third sub area includes a fourth pattern, the fourth pattern being continuous with any one of a plurality of conductive layers forming the third stepped structure among the conductive layers, and
at least one contact of the contacts is arranged between the fourth pattern and a terraced portion of a conductive layer continuous with the fourth pattern.

12. The device of claim 10, wherein
the third stepped structure and the fourth stepped structure have a structure symmetrical in the first direction except for differences in heights thereof.

13. The device of claim 10, wherein
a set of the first stepped structure and the second stepped structure includes a same structure as that of a set of the third stepped structure and the fourth stepped structure except for differences in heights thereof.

14. The device of claim 10, wherein
a contact provided on a first terraced portion of a lowermost layer among the first terraced portions is not surrounded by a conductive layer adjacent to a conductive layer corresponding to the first terraced portion of the lowermost layer.

15. The device of claim 1, wherein
the first terraced portions include a first dummy stepped structure ascending along the second direction in the first sub area, and
the second terraced portions include a second dummy stepped structure ascending along the second direction in the second sub area.

16. The device of claim 1, wherein
the conductive layers arranged in the third direction include the first terraced portion and the second terraced portion alternately.

17. The device of claim 16, wherein
each of the first sub area and the second sub area does not include a dummy stepped structure ascending or descending along the second direction.

18. The device of claim 1, wherein
the substrate further includes a third area containing at least one of the pillars, and the second area is sandwiched between the first area and the third area in the first direction.

19. The device of claim 18, wherein
at least one of the conductive layers is continuous between the first area and the third area for each of the block areas.

20. The device of claim 1, wherein
the first pattern is used for measuring a position of the second stepped structure.

* * * * *